US010985533B2

United States Patent
Nakatani et al.

(10) Patent No.: US 10,985,533 B2
(45) Date of Patent: Apr. 20, 2021

(54) SEMICONDUCTOR LASER DEVICE, SEMICONDUCTOR LASER MODULE, AND LASER LIGHT SOURCE SYSTEM FOR WELDING

(71) Applicant: Panasonic Intellectual Property Management Co., Ltd., Osaka (JP)

(72) Inventors: Tougo Nakatani, Toyama (JP); Takahiro Okaguchi, Toyama (JP); Norio Ikedo, Toyama (JP); Takeshi Yokoyama, Toyama (JP); Tomohito Yabushita, Osaka (JP); Toru Takayama, Toyama (JP); Shoichi Takasuka, Toyama (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 101 days.

(21) Appl. No.: 16/228,683

(22) Filed: Dec. 20, 2018

(65) Prior Publication Data

US 2019/0148916 A1 May 16, 2019

Related U.S. Application Data

(63) Continuation of application No. PCT/JP2017/022317, filed on Jun. 16, 2017.

(30) Foreign Application Priority Data

Jun. 30, 2016 (JP) .............................. JP2016-130546

(51) Int. Cl.
*H01S 5/34* (2006.01)
*H01S 5/343* (2006.01)
(Continued)

(52) U.S. Cl.
CPC .......... *H01S 5/3432* (2013.01); *H01S 5/0014* (2013.01); *H01S 5/2009* (2013.01);
(Continued)

(58) Field of Classification Search
CPC ............................ H01S 5/2009; H01S 5/3407
See application file for complete search history.

(56) References Cited

U.S. PATENT DOCUMENTS 6,118,799 A * 9/2000 Okubo ................... B82Y 20/00
372/46.01
6,555,403 B1 4/2003 Domen et al.
(Continued)

FOREIGN PATENT DOCUMENTS

CN 103384046 A 11/2013
JP H09-92936 A 4/1997
(Continued)

OTHER PUBLICATIONS

International Search Report (ISR) dated Sep. 5, 2017 in International (PCT) Application No. PCT/JP2017/022317.
(Continued)

*Primary Examiner* — Tod T Van Roy
(74) *Attorney, Agent, or Firm* — McDermott Will & Emery LLP

(57) ABSTRACT

A semiconductor laser device includes: a first semiconductor layer on a first conductivity side; a second semiconductor layer on the first conductivity side; an active layer; a third semiconductor layer on a second conductivity side different from the first conductivity side; and a fourth semiconductor layer on the second conductivity side. Eg2<Eg3 is satisfied, where Eg2 and Eg3 denote maximum values of band gap energy of the second semiconductor layer and the third semiconductor layer, respectively. The third semiconductor layer includes a first region layer in which band gap energy (Continued)

monotonically decreases toward the fourth semiconductor layer. N2>N3 is satisfied, where N2 denotes an impurity concentration of the second semiconductor layer, and N3 denotes an impurity concentration of the third semiconductor layer.

20 Claims, 11 Drawing Sheets

(51) Int. Cl.
| | |
|---|---|
| H01S 5/223 | (2006.01) |
| H01S 5/20 | (2006.01) |
| H01S 5/00 | (2006.01) |
| H01S 5/022 | (2021.01) |
| H01S 5/40 | (2006.01) |
| H01S 5/32 | (2006.01) |

(52) U.S. Cl.
CPC .......... *H01S 5/2231* (2013.01); *H01S 5/3407* (2013.01); *H01S 5/34313* (2013.01); *H01S 5/34353* (2013.01); *H01S 5/005* (2013.01); *H01S 5/02248* (2013.01); *H01S 5/3213* (2013.01); *H01S 5/4012* (2013.01)

(56) References Cited

U.S. PATENT DOCUMENTS

| | | | |
|---|---|---|---|
| 6,606,334 B1* | 8/2003 | Shigihara | H01S 5/223 372/45.01 |
| 7,920,612 B2* | 4/2011 | Johnson | B82Y 20/00 372/45.01 |
| 8,437,375 B2* | 5/2013 | Fujimoto | H01S 5/3213 372/45.01 |
| 2008/0137701 A1 | 6/2008 | Freund | |
| 2010/0270531 A1* | 10/2010 | Samal | B82Y 20/00 257/13 |
| 2017/0288368 A1* | 10/2017 | Takazane | H01S 5/022 |

FOREIGN PATENT DOCUMENTS

| | | |
|---|---|---|
| JP | H11-340580 A | 12/1999 |
| JP | 2007-227745 A | 9/2007 |
| JP | 3987138 B2 | 10/2007 |
| JP | 2008-16618 A | 1/2008 |
| JP | 2010-512666 A | 4/2010 |

OTHER PUBLICATIONS

Office Action and Search Report dated Feb. 22, 2021 issued in corresponding Chinese Patent Application No. 201780039851.9, with English translation of the Search Report.

* cited by examiner

STACKING DIRECTION

SEMICONDUCTOR LASER DEVICE, SEMICONDUCTOR LASER MODULE, AND LASER LIGHT SOURCE SYSTEM FOR WELDING

CROSS REFERENCE TO RELATED APPLICATIONS

This application is a U.S. continuation application of PCT International Patent Application Number PCT/JP2017/022317 filed on Jun. 16, 2017, claiming the benefit of priority of Japanese Patent Application Number 2016-130546 filed on Jun. 30, 2016, the entire contents of which are hereby incorporated by reference.

BACKGROUND

1. Technical Field

The present disclosure relates to semiconductor laser devices, and in particular, to semiconductor laser devices used as welding light sources, motion sensor light sources, display light sources, and light sources for other electronic devices and information processing devices.

2. Description of the Related Art

In recent years, there has been a demand for higher-output semiconductor laser devices in various fields. Conventionally, there has been a proposal for a configuration of this kind of semiconductor laser device in which carrier blocking layers which have high band gap energy and are thin enough so as not to disturb waveguide modes are provided on the sides of an active layer, and independent waveguide structures are provided on the outer sides of the carrier blocking layers. This configuration is intended to increase output by the semiconductor laser device. For example, in the semiconductor laser element disclosed in Japanese Unexamined Patent Application Publication No. H09-92936, as illustrated in FIG. 12A, second n-type cladding layer 31 made of n-$Al_{0.48}Ga_{0.52}As$, first n-type cladding layer 32 made of n-$Al_{0.30}Ga_{0.70}As$, n-type carrier blocking layer 33 made of n-$Al_{0.60}Ga_{0.40}As$, active layer 34 made of GaAs/$Al_{0.30}Ga_{0.70}As$ and having a double quantum well structure (DQW), p-type carrier blocking layer 35 made of p-$Al_{0.60}Ga_{0.40}As$ and having a trapezoid Al ratio, first p-type cladding layer 36 made of p-$Al_{0.30}Ga_{0.70}As$, second p-type cladding layer 37 made of p-$Al_{0.48}Ga_{0.52}As$, and p-type contact layer 39 made of p-GaAs are formed in the stated order on semiconductor substrate 40 made of n-GaAs. Further, current confining layer 38 made of n-GaAs is embedded in p-type contact layer 39 such that a central stripe portion is sandwiched from both sides. Note that ohmic electrodes 41 and 42 are formed on the upper surface of p-type contact layer 39 and the undersurface of semiconductor substrate 40, respectively. Here, p-type carrier blocking layer 35 has an Al ratio distribution with respect to the position in the thickness direction as illustrated in FIG. 12B.

The semiconductor laser element has a configuration that satisfies V>π/3, where π denotes the circular constant, λ denotes the oscillation wavelength, n1 denotes the greatest refractive index of a waveguide layer, n2 denotes the refractive index of the cladding layers, d1 denotes an effective thickness between the cladding layers, and normalized frequency V is defined by $V=(\pi \cdot d1/\lambda)\cdot(n1^2-n2^2)^{0.5}$.

Such a configuration prevents carriers in a quantum well layer from leaking out of active layer 34 due to thermal excitation when the temperature of the semiconductor laser element increases. This increases the upper limit of the temperature which allows laser oscillation, and thus increases heat saturation power in a continuous-oscillation state. Furthermore, formation of a spiking potential barrier formed on the joint plane between a carrier blocking layer and the adjacent layer is inhibited, whereby an increase in the operating voltage is inhibited. Further, the waveguide mode can be brought close to the Gaussian mode, and the peak intensity of the waveguide mode in the active layer region can be decreased. Accordingly, the light density on the end face from which emitted light exits can be reduced, thus inhibiting optical damage onto the end face.

The semiconductor laser element disclosed in Japanese Patent No. 3987138 includes a quantum well layer, an active layer which includes a barrier layer and a side barrier layer, and carrier blocking layers provided on the sides of the active layer. The semiconductor laser element disclosed in Japanese Patent No. 3987138 satisfies EG3≥EG2>EG1, where EG2 denotes an energy gap of the side barrier layer, EG3 denotes an energy gap of the carrier blocking layers, and EG1 denotes an energy gap of a waveguide layer. This can further reduce the peak intensity of a waveguide mode and can inhibit optical damage onto the end face, thus achieving high reliability. Furthermore, it is not necessary to increase the energy gaps of a cladding layer and the waveguide layer, and thus an increase in the heat resistance and electric resistance of the semiconductor laser element is inhibited, which reduces the amount of heat generated in the element. Accordingly, a high-output semiconductor laser element having high luminous efficiency can be obtained.

SUMMARY

A high-output semiconductor laser device which produces hundreds of watts of light output by continuous operation is achieved by a multi-emitter element in which a plurality of emitters are formed on a single substrate, typically in parallel to each other in the lengthwise direction of a resonator. However, a system of concentrating, by an optical element, light emitted from such a multi-emitter semiconductor laser device at one point has technical difficulty in concentrating light emitted from emitters at one point if a greater number of emitters are included. In order to concentrate the light emitted from the plurality of emitters at a smaller region, it is effective to reduce the number of emitters by increasing the light output per emitter. However, light to be output per emitter is high, which melts and damages the end face (COD: catastrophic optical damage) from which emitted light exits due to an increase in light density on the end face and/or thermal excitation of injected carriers in the active layer due to heat generated by the semiconductor laser element, and thus the function of confining carriers is deteriorated. This causes leakage of carriers out of the active layer, and thus the carriers no longer contribute to laser oscillation, which decreases the highest light output.

In the conventional semiconductor laser device, in order to increase the energy gaps of carrier blocking layers and to confine carriers in an active layer, a large amount of impurity is added to the carrier blocking layers. This is based on the following reasons. Since the carrier blocking layer needs high band gap energy, and thus a difference in band gap energy from the adjacent layer is inevitably large. If a layer having different band gap energy is joined, discontinuity resulting from the Fermi level difference occurs at the hetero interface. If more discontinuity occurs at the hetero interface, the operating voltage of the semiconductor laser element is increased and furthermore, carriers are prevented from being injected into the active layer, and thus luminous efficiency decreases also. Accordingly, it is necessary to add a large amount of impurity in order to eliminate the Fermi level difference of carrier blocking layers having high band gap energy.

The large amount of impurity added to the carrier blocking layers increases free carrier loss which causes absorption due to the interaction with light generated by the active layer. Accordingly, the internal loss of the semiconductor laser element increases. Slope efficiency SE of the semiconductor laser satisfies the relation $SE \propto \alpha_m/(\alpha_m+\alpha_i)$, where L denotes the length of a resonator, $R_f$ denotes reflectance of the front end face, $R_r$ denotes reflectance of the rear end face, $\alpha_i$ denote the internal loss, and $\alpha_m$ denotes resonator loss. Here, resonator loss am satisfies the relation $\alpha_m=1/(2\times L)\times \ln(1/R_f \times 1/R)$, and thus the degree of influence which internal loss such as free carrier loss have on slope efficiency increases with an increase in the length of the resonator. An increase in the internal loss due to high impurity concentration leads to an increase in the current value for obtaining desired optical output, and the amount of heat generated when obtaining such desired optical output increases, so that high luminous efficiency cannot be obtained. Further, carriers activated by generated heat readily go through the carrier block layers, which results in a further decrease in luminous efficiency.

In view of the above, an object of the present application is to provide, for instance, a semiconductor laser device which achieves an increase in efficiency of confining injected carriers in an active layer, a reduction in the potential barrier formed at the hetero interface of a carrier blocking layer, and a decrease in loss by lowering the impurity concentration.

A semiconductor laser device according to an aspect of the present disclosure includes: a first semiconductor layer on a first conductivity side; a second semiconductor layer on the first conductivity side, the second semiconductor layer having band gap energy higher than band gap energy of the first semiconductor layer; an active layer; a third semiconductor layer on a second conductivity side different from the first conductivity side; and a fourth semiconductor layer on the second conductivity side, the fourth semiconductor layer having band gap energy lower than band gap energy of the third semiconductor layer. Eg2<Eg3 is satisfied, where Eg2 denotes a maximum value of the band gap energy of the second semiconductor layer, and Eg3 denotes a maximum value of the band gap energy of the third semiconductor layer. The third semiconductor layer includes a first region layer in which band gap energy monotonically decreases toward the fourth semiconductor layer. N2>N3 is satisfied, where N2 denotes an impurity concentration of the second semiconductor layer, and N3 denotes an impurity concentration of the third semiconductor layer.

This configuration allows carriers to be efficiently confined in the active layer, and decreases band gap energy of the second semiconductor layer. Accordingly, an increase in the electric resistance of the semiconductor laser device and generation of heat by the semiconductor laser device can be inhibited. Furthermore, since the third semiconductor layer includes the first region layer in which band gap energy monotonically decreases toward the fourth semiconductor layer, a change in the band structure caused by joining layers having different band gap energy is eliminated by a change in the valence band structure due to a change in the composition ratios of the third semiconductor layer. Accordingly, for example, when the second conductivity side is a p side, an increase in the energy barrier against holes can be inhibited. Thus, an increase in the operating voltage of the semiconductor laser device can be inhibited, and an energy barrier against electrons can be increased. Furthermore, the free carrier loss on the second conductivity side can be decreased by adopting a relation of impurity concentration in which N2 indicating the impurity concentration of the second semiconductor layer is greater than N3 indicating the impurity concentration of the third semiconductor layer. The configuration of such impurity concentration is effective in particular when the second conductivity side is a p side where free carrier loss exerts great influence. As a result, an increase in electric resistance of the semiconductor laser device and generation of heat by the semiconductor laser device are inhibited and furthermore, slope efficiency can be improved. Accordingly, a high-output and highly efficient semiconductor laser device can be achieved. Further, the internal loss can be decreased by decreasing free carrier loss, and thus also when the length of the resonator is increased, high-output operation and highly efficient operation can be performed.

In the semiconductor laser device according an aspect of the present disclosure, the third semiconductor layer may include, between the first region layer and the active layer, a second region layer in which band gap energy monotonically increases toward the first region layer.

This configuration inhibits a spike-shaped energy barrier formed at the hetero interface between the active layer and the third semiconductor layer from being formed, thus inhibiting an increase in the operating voltage.

In the semiconductor laser device according an aspect of the present disclosure, the first region layer and the second region layer of the third semiconductor layer may be in contact with each other.

According to this configuration, the third semiconductor layer can be made thin in a state in which the energy barrier against electrons is high, and thus electric resistance of the third semiconductor layer can be decreased.

In the semiconductor laser device according an aspect of the present disclosure, a maximum value of the band gap energy of the first region layer and a maximum value of the band gap energy of the second region layer may be equal.

This configuration inhibits a spike-shaped energy barrier formed at the hetero interface between the first region layer and the second region layer from being formed, and thus an operating voltage can be inhibited from being increased.

In the semiconductor laser device according an aspect of the present disclosure, the first region layer may have a thickness of 20 nm or more.

This configuration causes composition ratios of the third semiconductor layer to gradually change, and thus a change in the valence band structure of the third semiconductor layer can be effectively eliminated by a change in the valence band structure caused by the change in the composition ratios. Thus, even when the impurity concentration of the third semiconductor layer is lowered and a change in the valence band structure is great relative to the change in composition ratios, a potential barrier of the third semiconductor layer on the valence band side can be maintained low, and thus an increase in the operating voltage can be inhibited.

In the semiconductor laser device according an aspect of the present disclosure, the second region layer may have a thickness of 20 nm or more.

This configuration causes composition ratios of the third semiconductor layer to gradually change, and thus a change in the valence band structure of the third semiconductor layer can be effectively eliminated by a change in the valence band structure caused by the change in the composition ratios. Thus, even when the impurity concentration of the third semiconductor layer is lowered and a change in the valence band structure is great relative to the change in composition ratios, a potential barrier of the third semiconductor layer on the valence band side can be maintained low, and thus an increase in the operating voltage can be inhibited.

In the semiconductor laser device according an aspect of the present disclosure, the third semiconductor layer may include an indirect band gap semiconductor layer.

A group III-V compound semiconductor is generally a direct band gap semiconductor, yet an AlGaAs based crystal and an AlGaInP based crystal each change from a direct band gap semiconductor to an indirect band gap semiconductor by increasing band gap energy by changing a ratio of a group III element. Accordingly, the third semiconductor layer includes an indirect band gap semiconductor, so that the band gap energy of the third semiconductor layer is increased. For example, when the second conductivity side is a p side, the band gap of the third semiconductor layer on the second conductivity side can be increased for electrons weakly confined in the active layer due to thermal excitation, and thus the carriers can be confined more strongly.

In the semiconductor laser device according an aspect of the present disclosure, the third semiconductor layer may include a group III-V compound semiconductor containing Al, and an Al ratio in the first region layer may have a gradient.

With this configuration, the band structure of the third semiconductor layer can be controlled by controlling the Al ratio, and a valence band structure within the third semiconductor layer can be controlled highly accurately.

In the semiconductor laser device according an aspect of the present disclosure, the first region layer may include an AlGaAs based crystal or an AlGaInP based crystal.

This configuration allows the band structure to be controlled more readily by changing the composition ratios of the first region layer. The height of a potential barrier against electrons can be further increased by using an AlGaInP based crystal, and thus the injected carriers can be inhibited from leaking out of the active layer. Accordingly, the heat saturation level increases and high-output operation can be performed.

In the semiconductor laser device according an aspect of the present disclosure, the first region layer may include a direct band gap semiconductor layer.

A direct band gap semiconductor layer and an indirect band gap semiconductor layer have different band structures for transition. Accordingly, if a direct band gap semiconductor and an indirect band gap semiconductor are joined, spikes occur due to band discontinuity at a joining interface, which results in an increase in the operating voltage. However, according to the above configuration, for example, changing the Al ratio in the first region layer allows a change from a direct band gap layer to an indirect band gap layer within the first region layer. Accordingly, the band structure in the first region layer can be effectively smoothed, and furthermore, spikes formed at a hetero interface between the first region layer and the fourth semiconductor layer can be inhibited from being formed. Thus, an operating voltage can be decreased.

In the semiconductor laser device according an aspect of the present disclosure, N2−N1≥N3−N4 may be satisfied, where N1 denotes an impurity concentration of the first semiconductor layer, and N4 denotes an impurity concentration of the fourth semiconductor layer on the second conductivity side.

This configuration achieves high luminous efficiency, and inhibits an increase in the operating voltage.

In the semiconductor laser device according an aspect of the present disclosure, N2 which denotes the impurity concentration of the second semiconductor layer may be $7 \times 10^{17}$ cm$^{-3}$ or less.

This configuration can decrease free carrier loss in the second semiconductor layer and the third semiconductor layer, improves slope efficiency, and achieves a highly efficient semiconductor laser device.

In the semiconductor laser device according an aspect of the present disclosure, Eg1≤Eg3min may be satisfied, where Eg1 denotes a maximum value of the band gap energy of the first semiconductor layer, and Eg3min denotes band gap energy in a portion of the first region layer adjacent to the fourth semiconductor layer.

This configuration allows the minimum value of the band gap energy of the third semiconductor layer to be greater than the band gap energy of the first semiconductor layer. Accordingly, for example, when the first region layer is a p-type semiconductor layer, the height of a potential barrier against electrons can be increased. Accordingly, electrons can be efficiently confined in the active layer, thus achieving high-output operation.

In the semiconductor laser device according an aspect of the present disclosure, the first semiconductor layer and the second semiconductor layer may be in contact with each other, the third semiconductor layer and the fourth semiconductor layer may be in contact with each other, and Eg1<Eg4 may be satisfied, where Eg1 denotes a maximum value of the band gap energy of the first semiconductor layer, and Eg4 denotes a maximum value of the band gap energy of the fourth semiconductor layer.

With this configuration, generally, band gap energy and a refractive index have an inversely proportional relation, and thus the refractive index of the first semiconductor layer is greater than the refractive index of the fourth semiconductor layer. Accordingly, the center position of the light intensity of a waveguide mode is located on the first semiconductor layer side rather than on the active layer, and thus free carrier loss on the second conductivity side can be effectively decreased. This achieves a semiconductor laser device which has high slope efficiency, and can perform low-current and high-output operation.

In the semiconductor laser device according an aspect of the present disclosure, the second semiconductor layer may be an n-type carrier blocking layer, and the third semiconductor layer may be a p-type carrier blocking layer.

This configuration allows the carrier block layers disposed on the n side and the p side to effectively confine injected carriers in the active layer. This achieves a semiconductor laser device which has high slope efficiency, and can perform low-current and high-output operation.

In the semiconductor laser device according an aspect of the present disclosure, the active layer may include a barrier layer, and a value obtained by subtracting an average Al ratio of the barrier layer from an average Al ratio of the p-type carrier blocking layer may be 0.31 or more.

This configuration allows a decrease in the influence exerted by a mounting stress onto the active layer, and thus deterioration of polarization characteristics can be inhibited.

A semiconductor laser module according an aspect of the present disclosure includes: the semiconductor laser device according to one of the above aspects.

This configuration achieves a semiconductor laser module which can operate with low power consumption owing to low-voltage and low-current operation, and perform high-output operation.

A laser light source system for welding according to an aspect of the present disclosure includes: the semiconductor laser module according to the above aspect.

This configuration can achieve a laser light source system for welding which operate with low power consumption and has high-output characteristics.

The present disclosure provides a semiconductor laser device which increases efficiency of confining injected carriers in the active layer, decreases a potential barrier formed at the hetero interface of a carrier block layer, and reduces loss by decreasing an impurity concentration.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

The following describes embodiments of the present disclosure, with reference to the drawings. Note that the embodiments described below each show a specific example of the present disclosure. The numerical values, elements, the arrangement and connection of the elements, steps, and the order of the steps, for instance, indicated in the following embodiments are mere examples, and are not intended to limit the present disclosure. Therefore, among the elements in the following embodiments, elements not recited in any of the independent claims defining the most generic part of the present disclosure are described as arbitrary elements.

In the present specification, the terms "above" and "below" do not indicate upward (vertically upward) and downward (vertically downward) in the absolute recognition of space, but are rather used as terms defined by a relative positional relation based on the stacking order in a stacked configuration. Furthermore, the terms "above" and "below" are used not only when two elements are spaced apart from each other and another element is present therebetween, but also when two elements are in close contact with each other and touch each other.

Embodiment 1

The following describes a semiconductor laser device according to Embodiment 1, with reference to the drawings.

Figure 1:
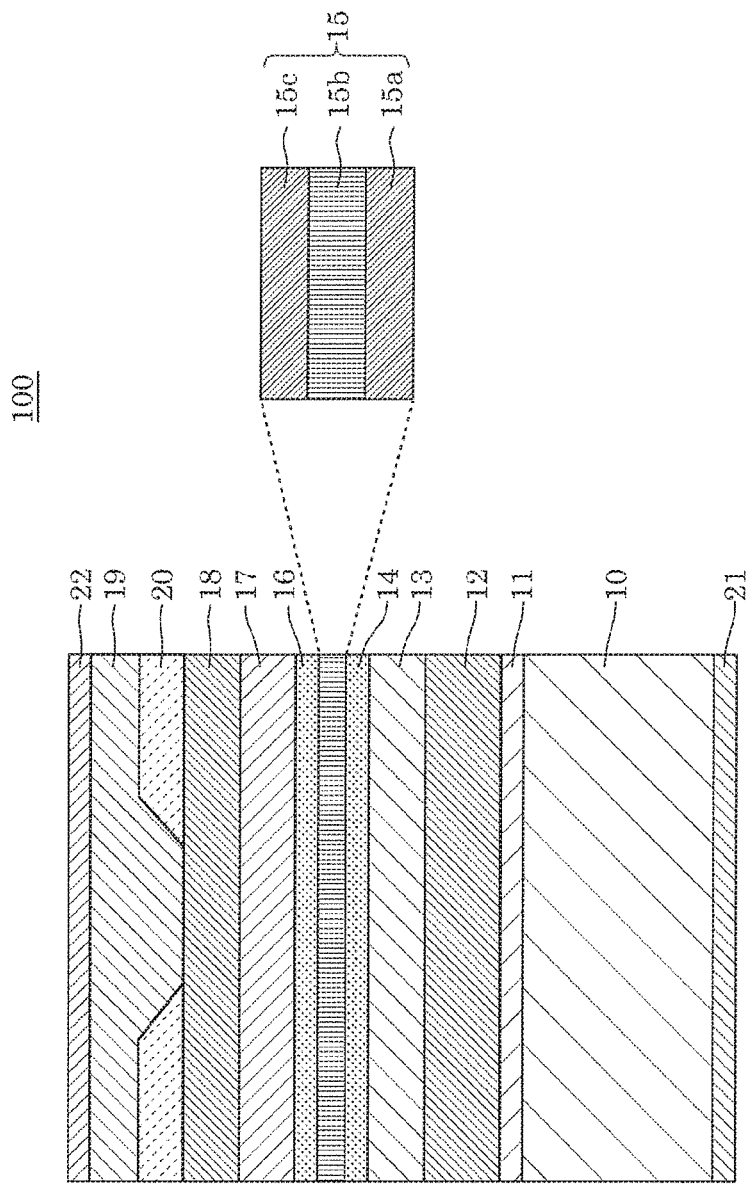
FIG. 1 is a schematic diagram illustrating a cross-sectional structure of a semiconductor laser device according to Embodiment 1.

FIG. 1 is a schematic diagram illustrating a cross-sectional structure of semiconductor laser device 100 according to the present embodiment.

Semiconductor laser device 100 according to the present embodiment includes: a first semiconductor layer on a first conductivity side; a second semiconductor layer on the first conductivity side, the second semiconductor layer having band gap energy higher than band gap energy of the first semiconductor layer; active layer 15; a third semiconductor layer on a second conductivity side different from the first conductivity side; and a fourth semiconductor layer on the second conductivity side, the fourth semiconductor layer having band gap energy lower than band gap energy of the third semiconductor layer. In the present embodiment, the first conductivity side and the second conductivity side are an n side and a p side, respectively. Semiconductor laser device 100 according to the present embodiment includes n-type waveguide layer 13 which is an example of the first semiconductor layer, n-type carrier blocking layer 14 which is an example of the second semiconductor layer, active layer 15, p-type carrier blocking layer 16 which is an example of the third semiconductor layer, and p-type waveguide layer 17 which is an example of the fourth semiconductor layer, as illustrated in FIG. 1. Semiconductor laser device 100 further includes n-type buffer layer 11, n-type cladding layer 12, and p-type cladding layer 18.

N-type waveguide layer 13 which is an example of the first semiconductor layer is a semiconductor layer for guiding light generated in active layer 15. N-type waveguide layer 13 is disposed in a position more distant from active layer 15 than the second semiconductor layer is. In semiconductor laser device 100, light is guided to n-type waveguide layer 13 by making the refractive index of n-type waveguide layer 13 greater than that of n-type cladding layer 12.

N-type carrier blocking layer 14 which is an example of the second semiconductor layer is a semiconductor layer for confining carriers in active layer 15. N-type carrier blocking layer 14 is disposed between active layer 15 and the first semiconductor layer. N-type carrier blocking layer 14 forms a potential barrier for confining carriers in active layer 15.

Active layer 15 is a luminous layer of semiconductor laser device 100. Active layer 15 is disposed between the second semiconductor layer and the third semiconductor layer.

P-type carrier blocking layer 16 which is an example of the third semiconductor layer is a semiconductor layer for confining carriers in active layer 15. P-type carrier blocking layer 16 is disposed between active layer 15 and the fourth semiconductor layer. P-type carrier blocking layer 16 forms a potential barrier for confining carriers in active layer 15.

P-type waveguide layer 17 which is an example of the fourth semiconductor layer is a semiconductor layer for guiding light generated in active layer 15. P-type waveguide layer 17 is in a more distant position from active layer 15 than the third semiconductor layer is. In semiconductor laser device 100, light is guided to p-type waveguide layer 17 by making a refractive index of p-type waveguide layer 17 greater than that of p-type cladding layer 18.

More specifically, semiconductor laser device 100 includes substrate 10 made of n-type GaAs, and n-type buffer layer 11 (having a thickness of 0.5 μm) made of n-type GaAs, n-type cladding layer 12 (having a thickness of 3.08 μm) made of n-type AlGaAs, n-type waveguide layer 13 (having a thickness of 0.55 μm) made of n-type AlGaAs, n-type carrier blocking layer 14 (having a thickness of 0.045 μm) made of n-type AlGaAs, active layer 15 having a quantum well structure, p-type carrier blocking layer 16 (having a thickness of 0.05 μm) made of p-type AlGaAs, p-type waveguide layer 17 (having a thickness of 0.18 μm) made of p-type AlGaAs, and p-type cladding layer 18 (having a thickness of 0.65 μm) made of p-type AlGaAs which are stacked above substrate 10 in the stated order.

Active layer 15 includes barrier layer 15a made of AlGaAs, quantum well layer 15b made of InGaAs, and barrier layer 15c made of AlGaAs, all of which are stacked above n-type carrier blocking layer 14 in the stated order, as illustrated in FIG. 1.

Here, in the present embodiment, the Al ratio of n-type cladding layer 12 is set to 0.292, and the Al ratio of p-type cladding layer 18 is set to 0.65, in order to confine light perpendicularly to the principal surface of active layer 15 (or in other words, in the direction normal to the substrate). In a group III-V compound semiconductor, the higher the Al ratio is, the smaller the refractive index is. Since the refractive index of the n-type cladding layer is greater than the refractive index of the p-type cladding layer as described above, the center of the intensity of the waveguide mode of light generated in active layer 15 can be placed in n-side layers between active layer 15 and substrate 10. In this manner, the intensity of light in active layer 15 can be decreased, and thus melting and damaging the end face (COD on the end face) from which emitted light exits can be inhibited, by causing the center of light intensity of the waveguide mode to be in the n-side layers.

In the present embodiment, the Al ratio of n-type waveguide layer 13 is 0.22 and the Al ratio of p-type waveguide layer 17 is 0.25, to confine, in the n-side layers, the waveguide modes of light generated in active layer 15. Accordingly, the center of the intensity of light generated in active layer 15 is in the n-type waveguide layer having a high refractive index. Specifically, the light intensity in active layer 15 can be reduced, and thus the occurrence of COD on an end face from which emitted light exits can be inhibited more effectively. Accordingly, this allows a high-output operation of semiconductor laser device 100.

In order to obtain laser oscillation having a wavelength of 970 nm, active layer 15 according to the present embodiment has a single quantum well (SQW) structure which includes quantum well layer 15b having a thickness of 8 nm and made of InGaAs having an In ratio of 0.15, as illustrated in FIG. 1. Barrier layers 15a and 15c have a thickness of 5 nm and a thickness of 10 nm, respectively, and both have an Al ratio of 0.2.

Semiconductor laser device 100 according to the present embodiment further includes current confining layer 20. Current confining layer 20 is made of n-type GaAs, and is formed on p-type cladding layer 18. An opening through which current flows is formed in current confining layer 20. Current confining layer 20 that is transparent to light having a laser oscillation wavelength of 970 nm can be achieved by forming current confining layer 20 using n-type GaAs. Accordingly, current confining layer 20 less absorbs light generated in active layer 15, and thus semiconductor laser device 100 can be operated with high efficiency.

Semiconductor laser device 100 according to the present embodiment further includes p-type contact layer 19 made of p-type GaAs. P-type contact layer 19 is formed on p-type cladding layer 18, filling the opening region of current confining layer 20. If an impurity is added to GaAs used to form p-type contact layer 19 such that the impurity concentration becomes high, crystallinity of GaAs deteriorates while resistance decreases. Accordingly, in the present embodiment, contact resistance is decreased by decreasing the impurity concentration of a portion of p-type contact layer 19 closer to active layer 15 and increasing the impurity concentration of a portion of p-type contact layer 19 in contact with p-side electrode 22. When a current confined by current confining layer 20 flows into active layer 15, spread of the current in the transverse direction can be controlled by adjusting the impurity concentration of p-type contact layer 19. In the present embodiment, the impurity concentration of the portion of p-type contact layer 19 on the active layer 15 side is decreased in order to achieve low-threshold operation by controlling the waveguide mode in the transverse direction and reducing a current that leaks in the transverse direction.

Note that p-side electrode 22 is formed on the surface of p-type contact layer 19, and n-side electrode 21 is formed on the undersurface of substrate 10 (lower surface in FIG. 1).

The semiconductor laser device having such a structure can be produced by epitaxial growth such as molecular beam epitaxy (MBE) or metal organic chemical vapor deposition (MOCVD). Note that semiconductor laser device 100 according to the present embodiment is produced by MOCVD.

Figure 2:
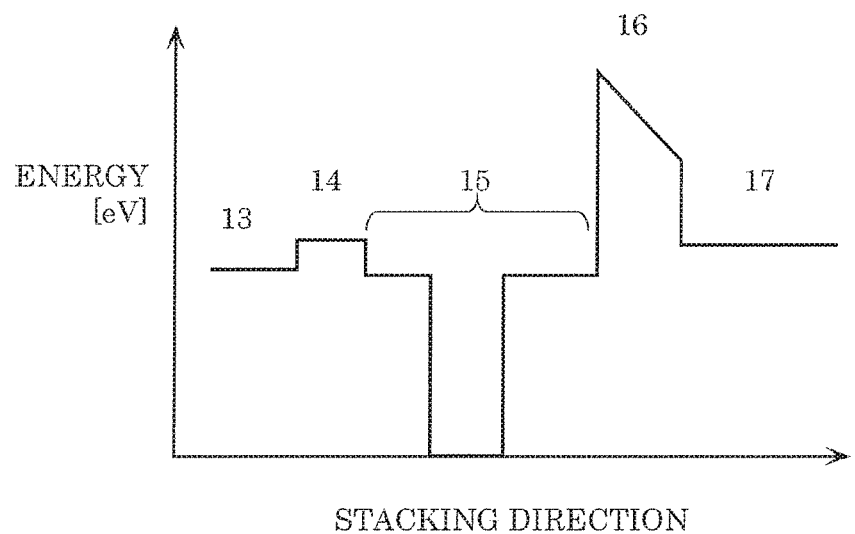
FIG. 2 is a schematic diagram illustrating a distribution of band gap energy of the semiconductor laser device according to Embodiment 1.

The following describes n-type carrier blocking layer 14 and p-type carrier blocking layer 16, with reference to FIG. 2.

FIG. 2 is a schematic diagram illustrating a distribution of band gap energy of semiconductor laser device 100 according to the present embodiment.

N-type carrier blocking layer 14 and p-type carrier blocking layer 16 have band gap energy as illustrated in FIG. 2. P-type carrier blocking layer 16 includes a first region layer in which band gap energy monotonically decreases from active layer 15 toward the p-type waveguide layer 17 which is an example of the fourth semiconductor layer. Specifically, in the first region layer, the Al ratio is changed from 0.65 to 0.42 in the direction from active layer 15 to p-type waveguide layer 17. N-type carrier blocking layer 14 has fixed band gap energy that is lower than the band gap energy of p-type carrier blocking layer 16. Specifically, such band gap energy is achieved by setting the Al ratio of n-type carrier blocking layer 14 to 0.24. In the present embodiment, since semiconductor laser device 100 includes the first region layer, a change in the band structure can be eliminated by changing the valence band structure due to a change in the composition ratios of p-type carrier blocking layer 16, and an increase in the energy barrier against holes can be inhibited. Accordingly, an increase in the operating voltage of semiconductor laser device 100 can be inhibited, and energy barrier against electrons can be increased.

The relation $Eg1 \leq Eg3min$ is satisfied, where $Eg1$ denotes the maximum value of band gap energy of n-type waveguide layer 13, and $Eg3min$ denotes band gap energy in the first region layer on the p-type waveguide layer 17 side. This configuration can make the minimum value of band gap energy of p-type carrier blocking layer 16 greater than band gap energy of n-type waveguide layer 13. Accordingly, the height of the potential barrier against electrons can be increased. Thus, electrons can be efficiently confined in active layer 15, and high-output operation can be performed. Note that in the present disclosure, "monotonically decrease" may simply indicate a decreasing change in a value, and include any change such as a linear change, a curved change, and a stepped change.

As described above, p-type carrier blocking layer 16 includes a group III-V compound semiconductor which contains Al, and the Al ratio has a gradient in the first region layer. With this configuration, the control of the Al ratio allows the band structure of p-type carrier blocking layer 16 to be controlled, and the valence band structure in p-type carrier blocking layer 16 can be controlled with high precision.

The first region layer includes an AlGaAs based crystal as described above. This configuration allows the band structure to be more readily controlled using a change in the composition ratios of the first region layer. Use of an AlGaInP based crystal as the first region layer allows the height of a potential barrier against electrons to be further increased, and prevents injected carriers to be leaked out of the active layer. Accordingly, the heat saturation level increases and high-output operation can be performed.

N-type waveguide layer 13 and n-type carrier blocking layer 14 are disposed in contact with each other, and p-type carrier blocking layer 16 and p-type waveguide layer 17 are disposed in contact with each other. Further, the relation $Eg1 < Eg4$ is satisfied, where $Eg1$ denotes the maximum value of the band gap energy of n-type waveguide layer 13 and $Eg4$ denotes the maximum value of the band gap energy of p-type waveguide layer 17. With this configuration, the refractive index of n-type waveguide layer 13 is greater than the refractive index of p-type waveguide layer 17, since the relation between band gap energy and a refractive index is generally inversely proportional. Accordingly, the center position of the light intensity of a waveguide mode is located on the n-type waveguide layer 13 side rather than on active layer 15, and free carrier loss on the p side (second conductivity side) can be more effectively decreased. Accordingly, this achieves semiconductor laser device 100 which has high slope efficiency, can operate using low current, and can perform high-output operation.

P-type carrier blocking layer 16 is formed so as to have higher band gap energy than the band gap energy of barrier layer 15c. N-type carrier blocking layer 14 is formed so as to have higher band gap energy than the band gap energy of barrier layer 15a. Such a configuration allows injected carriers to be efficiently confined in active layer 15. In the present embodiment, n-type carrier blocking layer 14 and p-type carrier blocking layer 16 are formed such that the maximum value of band gap energy of p-type carrier blocking layer 16 is greater than the maximum value of the band gap energy of n-type carrier blocking layer 14. Thus, $Eg2 < Eg3$ is satisfied, where $Eg2$ denotes the maximum value of band gap energy of n-type carrier blocking layer 14 which is an example of the second semiconductor layer, and $Eg3$ denotes the maximum value of band gap energy of p-type carrier blocking layer 16 which is an example of the third semiconductor layer. This configuration allows carriers to be efficiently confined in the active layer even when the injected carriers are excited by heat generated by semiconductor laser device 100. Here, the reason why band gap energy of n-type carrier blocking layer 14 is lower than band gap energy of p-type carrier blocking layer 16 is that the effective mass of electrons is smaller than that of holes when semiconductor laser device 100 is formed using a group III-V compound semiconductor such as AlGaAs, InGaAs, InGaAsP, or AlGaInP. Here, effective masses of electrons and holes in the group III-V compound semiconductor are to be described with reference to FIG. 3.

Figure 3:
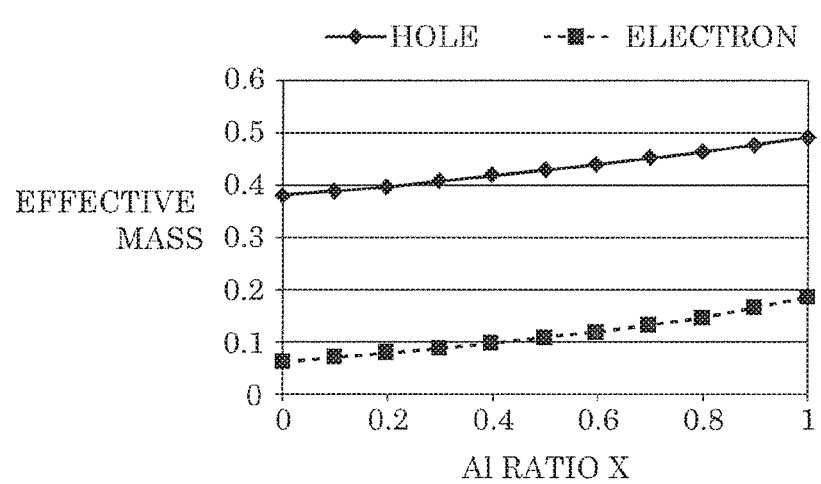
FIG. 3 is a graph illustrating effective masses of electrons and holes when Al ratio x in $Al_xGa_{(1-x)}As$ is a variable.

FIG. 3 is a graph illustrating effective masses of electrons and holes when Al ratio x in $Al_xGa_{(1-x)}As$ is a variable.

As illustrated in FIG. 3, electrons have a smaller effective mass than that of holes, and thus the carrier density of electrons is relatively higher than that of holes. Thus, even if band gap energy of n-type carrier blocking layer 14 which forms a potential barrier against holes is made lower than band gap energy of p-type carrier blocking layer 16, confinement of carriers in active layer 15 is not deteriorated. Further, effective mass is larger in proportion to Al ratio x, and thus the greater Al ratio x is, the more difficulty electrons have to go through the potential barrier. That is, band gap energy of n-type carrier blocking layer 14 is made low and band gap energy of p-type carrier blocking layer 16 is made high, whereby efficiency of confining carriers in the active layer can be increased.

The energy gap of n-type carrier blocking layer 14 can be made smaller than that of p-type carrier blocking layer 16, and thus the Al ratio of n-type carrier blocking layer 14 can be decreased and the resistance of n-type carrier blocking layer 14 can be reduced. Furthermore, the Al ratio of n-type carrier blocking layer 14 is made low, so that a difference in refractive index between n-type carrier blocking layer 14 and n-type waveguide layer 13 can be decreased, and thus the influence of n-type carrier blocking layer 14 onto a waveguide mode can be decreased. As a result, light can be sufficiently confined in active layer 15, and heat generated by semiconductor laser device 100 can be inhibited, which allows high-output operation.

N-type carrier blocking layer 14 and p-type carrier blocking layer 16 are provided to efficiently confine carriers in active layer 15. The effective masses of holes and electrons are different in a semiconductor laser device formed using a group III-V compound semiconductor as described above with reference to FIG. 3, and thus a layer in which electrons having a smaller effective mass are confined may be given a greater thickness than that of a layer in which holes having greater effective mass are confined. For example, n-type carrier blocking layer 14 may have a thickness of 5 nm or more, and p-type carrier blocking layer 16 may have a thickness of 10 nm or more. Accordingly, this can inhibit the confinement function of potential barriers against holes and electrons from deteriorating due to the tunneling effect. The carrier blocking layers may be disposed in the proximity to active layer 15, in order to effectively carry out the function.

Light generated in active layer 15 is confined in the waveguide layers and the cladding layers located in positions more distant from active layer 15 than the carrier blocking layers are, and forms waveguide modes. As described above, generally, a semiconductor laser device suffers from loss of free carriers as the internal loss that the waveguide modes undergo. The loss of free carriers is determined by the concentrations and types of an impurity added to achieve an n-type semiconductor and a p-type semiconductor. It is known that more free carriers are lost as the impurity concentration increases, and more free carriers are lost in the p-type semiconductor layer than in the n-type semiconductor layer. Accordingly, impurity concentrations in n-type carrier blocking layer 14 and p-type carrier blocking layer 16 may be decreased in order to cause the semiconductor laser device to operate highly efficiently. In particular, in order to decrease the loss of free carriers in the p-type semiconductor layer, N2>N3 may be satisfied, where N2 denotes an impurity concentration in n-type carrier blocking layer 14 which is an example of the second semiconductor layer, and N3 denotes an impurity concentration in p-type carrier blocking layer 16 which is an example of the third semiconductor layer.

In the structure of the semiconductor laser device according to the conventional technology disclosed in Japanese Unexamined Patent Application Publication No. H09-92936, n-type and p-type carrier blocking layers have a thickness of 20 nm, and an impurity concentration of $1\times10^{18}$ cm$^{-3}$ or more. If this thickness and the impurity concentration are applied to the structure of the present embodiment, the operating voltage is 1.51 V. If the impurity concentration is lowered, the discontinuity of the valence band structure causes spikes in the valence band at the interfaces between the active layer and the carrier blocking layers and the interfaces between the carrier blocking layers and the waveguide layers so that the operating voltage increases and furthermore, the resistibility of the carrier blocking layers increases, and consequently the operating voltage increases. The following describes a band structure and an operating voltage of semiconductor laser device 100 according to the present embodiment, with reference to the drawings.

Figure 4A:
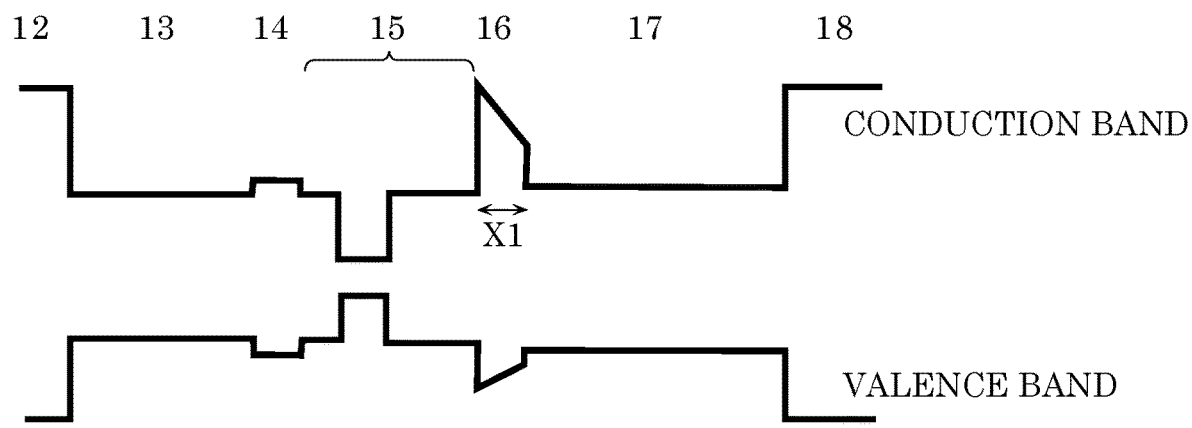
FIG. 4A is a schematic diagram illustrating a band structure which includes a conduction band and a valence band in the semiconductor laser device according to Embodiment 1.
Figure 4B:
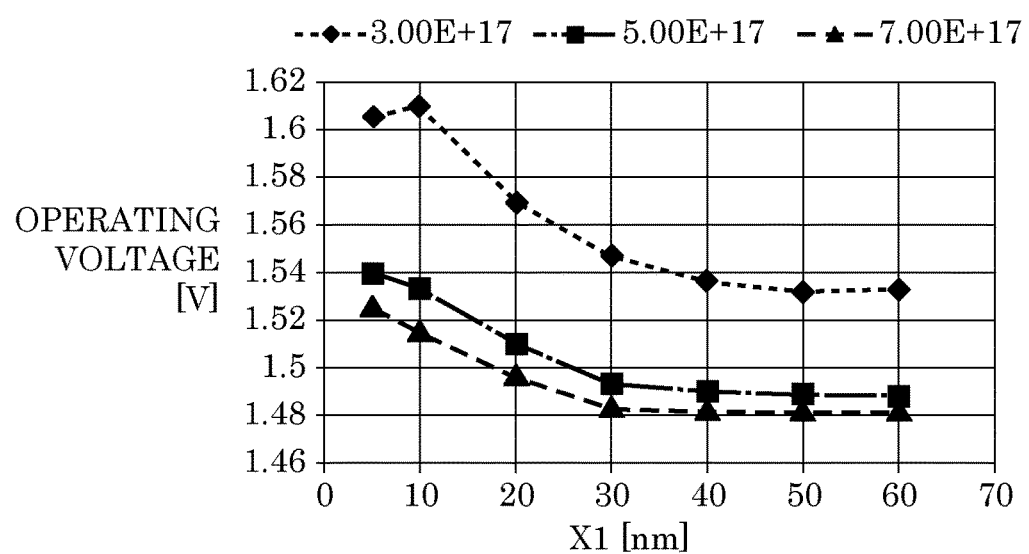
FIG. 4B is a graph illustrating results of calculating a relation of an operating voltage to thickness X1 of a first region layer of the semiconductor laser device according to Embodiment 1.

FIG. 4A is a schematic diagram illustrating a band structure which includes a conduction band and a valence band in semiconductor laser device 100 according to the present embodiment. FIG. 4B illustrates a graph illustrating results of calculating a relation of the operating voltage to thickness X1 of a first region layer in semiconductor laser device 100 according to the present embodiment.

FIG. 4B illustrates the results of calculating the operating voltage for thickness X1 of the first region layer when, in the band structure based on the present embodiment as illustrated in FIG. 4A, the impurity concentration of n-type waveguide layer 13 is $5\times10^{16}$ cm$^{-3}$, the impurity concentration of p-type waveguide layer 17 is $3\times10^{17}$ cm$^{-3}$, the Al ratio of n-type carrier blocking layer 14 is 0.24, the impurity concentration of n-type carrier blocking layer 14 is $7\times10^{17}$ cm$^{-3}$, the maximum value of the Al ratio of p-type carrier blocking layer 16 is 0.65, and the Al ratio with which band gap energy of the first region layer is the lowest is 0.42. Note that the operating voltage is calculated under three conditions that the impurity concentration of p-type carrier blocking layer 16 is $3\times10^{17}$ cm$^{-3}$, $5\times10^{17}$ cm$^{-3}$, and $7\times10^{17}$ cm$^{-3}$. The reason for setting the Al ratio of p-type carrier blocking layer 16 to 0.65 is that if the Al ratio is 0.7 or more, an impurity cannot be added in amount that makes the concentration high, and furthermore, the resistibility of p-type carrier blocking layer 16 increases, thus resulting in difficulty in driving at a low voltage.

As illustrated in FIG. 4B, the operating voltage increases when the impurity concentration is decreased, yet an increase in thickness X1 of the first region layer makes less change in the valence band structure due to a change in the Al ratio. Accordingly, the band structure is smoothed, and the energy barrier on the valence band side is lowered, so that the operating voltage is considered to be decreasing. In the structure according to conventional technology, the operating voltage is 1.51 V, and thus according to the structure based on the present embodiment, even if the impurity concentration of p-type carrier blocking layer 16 is $5\times10^{17}$ cm$^{-3}$, the operating voltage can be made equivalent to the voltage according to conventional technology or less, by causing thickness X1 of the first region layer to be 20 nm or more. Accordingly, the thickness of the first region layer may be 20 nm or more. Note that thickness X1 may be 100 nm or less, for example.

Furthermore, a potential barrier against electrons in the conduction band is increased by increasing thickness X1 of the first region layer. This is because a change in the valence band structure is effectively reduced relative to a change in composition ratios of p-type carrier blocking layer 16, as described above. Accordingly, a change in the Fermi level relative to a change in the composition ratios is decreased if the first region layer has larger thickness X1, so that spikes in the valence band are inhibited and furthermore, the height of a potential barrier of the conduction band is increased. Accordingly, leakage of carriers from the active layer is inhibited, the heat saturation level improves, and high-output operation can be performed.

As illustrated in FIG. 4B, also when N2>N3 is satisfied, where N2 denotes the impurity concentration of n-type carrier blocking layer 14, and N3 denotes the impurity concentration of p-type carrier blocking layer 16, loss of free carriers in a p-type semiconductor layer can be reduced, and thus the operating voltage can be decreased. In the present embodiment, N2 is $7\times10^{17}$ cm$^{3}$, and thus N3 is less than $7\times10^{17}$ cm$^{-3}$.

N2 which denotes the impurity concentration of n-type carrier blocking layer 14 may be $7\times10^{17}$ cm$^{-3}$ or less. This configuration reduces the loss of free carriers in n-type carrier blocking layer 14 and p-type carrier blocking layer 16 so that slope efficiency improves, thus achieving a highly efficient semiconductor laser device. Note that N2 which denotes the impurity concentration may be, for example, $5\times10^{16}$ cm$^{-3}$ or more.

Generally, it is necessary to smooth the valence band structure in p-type carrier blocking layer 16 and inhibit an increase in voltage by causing the impurity concentration of p-type carrier blocking layer 16 having higher band gap energy to be higher than that of n-type carrier blocking layer 14. However, according to the present disclosure, the impurity concentration of p-type carrier blocking layer 16 can be lowered by providing the first region layer which is a region in which an Al ratio has a gradient in p-type carrier blocking layer 16. Accordingly, for example, also when each of the carrier blocking layers has the same impurity concentration as that of an adjacent waveguide layer by causing n-type waveguide layer 13 to have an impurity concentration of $5 \times 10^{16}$ cm$^{-3}$, n-type carrier blocking layer 14 to have an impurity concentration of $5 \times 10^{16}$ cm$^{-3}$, p-type carrier blocking layer 16 to have an impurity concentration of $3 \times 10^{17}$ cm$^{-3}$, and p-type waveguide layer 17 to have an impurity concentration of $3 \times 10^{17}$ cm$^{-3}$, a rise in the operating voltage can be inhibited by causing the first region layer to have thickness X1 of 20 nm or more. Specifically, high luminous efficiency can be obtained by causing a difference between the impurity concentration of p-type carrier block layer 16 and the impurity concentration of p-type waveguide layer 17 to be the same as or less than a difference between the impurity concentration of n-type carrier block layer 14 and the impurity concentration of n-type waveguide layer 13, and also a rise in the voltage in each carrier block layer can be inhibited. In other words, high luminous efficiency can be obtained, and furthermore a rise in operating voltage can be inhibited, by satisfying N2−N1≥N3−N4, where N1 denotes the impurity concentration of n-type waveguide layer 13 which is an example of the first semiconductor layer, and N4 denotes the impurity concentration of p-type waveguide layer 17 which is an example of the fourth semiconductor layer.

Furthermore, the loss of free carriers in p-type carrier blocking layer 16 decreases and slope efficiency improves by lowering the impurity concentration of p-type carrier blocking layer 16, so that the operating current can be reduced. Accordingly, power consumption can be reduced, generation of heat in semiconductor laser device 100 is inhibited, and also leakage of carriers due to thermal excitation is inhibited, thus allowing semiconductor laser device 100 to be driven to output light with high power.

As a result, electrons can be more effectively confined within the active layer, the operating voltage and the operating current can be decreased, and furthermore, leakage of carriers from the active layer is inhibited by reducing heat generated in semiconductor laser device 100, so that the heat saturation level improves and high-output operation can be performed.

Variation 1 of Embodiment 1

A semiconductor laser device according to Variation 1 of Embodiment 1 is to be described. A semiconductor laser device according to this variation is semiconductor laser device 100 according to Embodiment 1 in which p-type carrier blocking layer 16 which is an example of the third semiconductor layer further includes, between the first region layer and active layers 15, a second region layer in which band gap energy monotonically increases toward the first region layer. The following describes the semiconductor laser device according to this variation with reference to the drawings. In the present disclosure, "monotonically increase" may simply be an increasing change of a value, and includes any changes such as linear change, curved change, and stepped change.

Figure 5A:
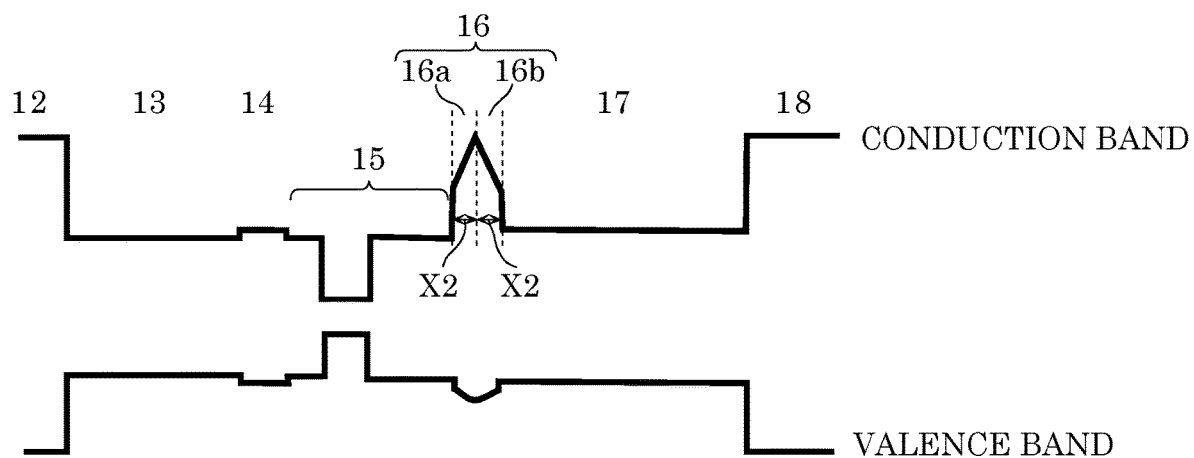
FIG. 5A is a schematic diagram illustrating a band structure which includes a conduction band and a valence band in a semiconductor laser device according to Variation 1 of Embodiment 1.
Figure 5B:
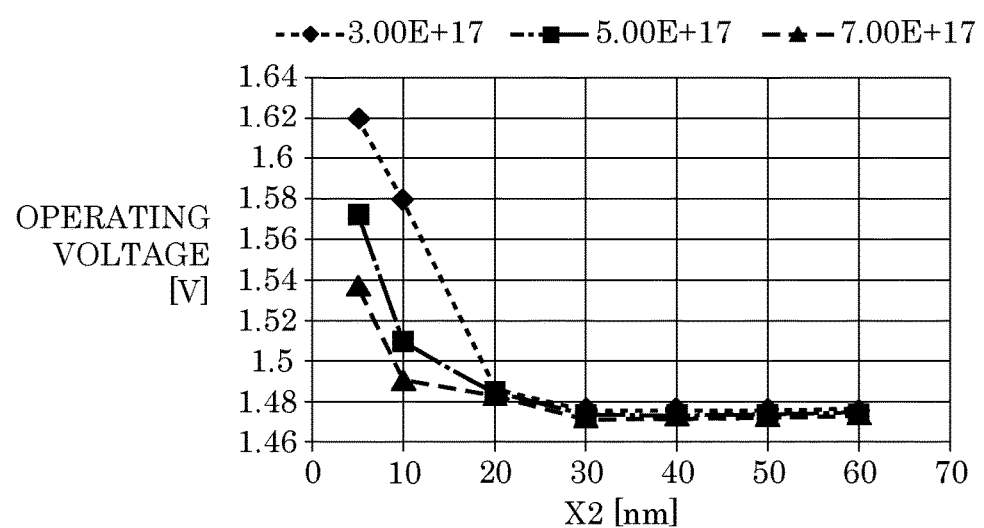
FIG. 5B is a graph illustrating results of calculating a relation of an operating voltage to thickness X2 of a first region layer and a second region layer of the semiconductor laser device according to Variation 1 of Embodiment 1.

FIG. 5A is a schematic diagram illustrating a band structure which includes a conduction band and a valence band in the semiconductor laser device according to this variation. FIG. 5B is a graph illustrating results of calculating a relation of an operating voltage to thickness X2 of first region layer 16b and second region layer 16a in the semiconductor laser device according to this variation. As illustrated in FIG. 5B, the relation is calculated under three conditions that the impurity concentration of p-type carrier blocking layer 16 is $3 \times 10^{17}$ cm$^{-3}$, $5 \times 10^{17}$ cm$^{-3}$, and $7 \times 10^{17}$ cm$^{-3}$.

Specifically, p-type carrier blocking layer 16 includes second region layer 16a having an Al ratio changed from 0.42 to 0.65 as farther from active layer 15 and closer to p-type waveguide layer 17, as illustrated in FIG. 5A. P-type carrier blocking layer 16 further includes first region layer 16b which is in contact with second region layer 16a, has an Al ratio changed from 0.65 to 0.42 as farther from active layer 15 and closer to p-type waveguide layer 17. Note that the other configuration of the semiconductor laser device according to this variation is similar to that of semiconductor laser device 100 according to Embodiment 1.

As described above, p-type carrier blocking layer 16 forms a potential barrier against electrons, and has a function for confining electrons within active layer 15, and thus forms a potential barrier by making the Al ratio higher than the Al ratios of adjacent layers. In Embodiment 1, the first region layer in which the Al ratio has a gradient is provided on the p-type waveguide layer 17 side, and thus the operating voltage is reduced by effectively smoothing the valence band structure at the hetero interface and the height of a potential barrier against electrons is increased, so that the semiconductor laser device can perform low-voltage high-output operation. An improvement in the characteristics by providing such a first region layer can be similarly applied to p-type carrier blocking layer 16 on the active layer 15 side. Thus, a spike-shaped energy barrier is inhibited from being formed at a hetero interface with active layer 15, by adopting a configuration in which p-type carrier blocking layer 16 includes second region layer 16a in which band gap energy monotonically decreases in the direction from first region layer 16b toward active layer 15. Accordingly, this inhibits the band discontinuity at the hetero interface, and allows reduction in the operating voltage.

Furthermore, first region layer 16b and second region layer 16a are in contact with each other in this variation. With this configuration, the thickness of the p-type carrier blocking layer can be decreased in a state where the height of the energy barrier against electrons is maintained high, and thus the electric resistance of the p-type carrier blocking layer can be decreased.

In this variation, first region layer 16b and second region layer 16a have the same maximum value of band gap energy. With this configuration, a spike-shaped energy barrier can be inhibited from being formed at the hetero interface between first region layer 16b and second region layer 16a, and thus the operating voltage can be inhibited from increasing.

As illustrated in FIG. 5B, by increasing thickness X2 of first region layer 16b and second region layer 16a, an operating voltage is decreased and furthermore, an energy barrier on the conduction band is increased. The result shows that operation can be performed at a low voltage without depending on the impurity density, by setting X2 to 20 nm or more. Thus, first region layer 16b and second region layer 16a may each have a thickness of 20 nm or more. Note that thickness X2 may be 100 nm or less, for example.

Thus, also in the case where an impurity of $3 \times 10^{17}$ cm$^{-3}$ is added to the p-type carrier blocking layer, the operating voltage can be decreased by 0.02 V, as compared to the semiconductor laser device according to conventional technology. The results of calculation show that by decreasing the impurity concentration, the internal loss can be decreased by 0.1 cm$^{-1}$ as compared to the semiconductor laser device according to conventional technology. Accordingly, the operating current can be decreased in the semiconductor laser device according to this variation. Thus, power consumption of the semiconductor laser device can be inhibited. As a result, leakage of carriers from active layer 15 by the semiconductor laser device generating heat is inhibited, and high-output operation can be performed.

Variation 2 of Embodiment 1

The semiconductor laser device according to Variation 2 of Embodiment 1 is to be described. The semiconductor laser device according to this variation has a configuration in which in the semiconductor laser device disclosed in Variation 1 of Embodiment 1, N2>N3 is satisfied, where N2 denotes the impurity concentration of n-type carrier blocking layer 14, and N3 denotes the impurity concentration of p-type carrier blocking layer 16. Specifically, the impurity concentration of n-type waveguide layer 13 is 5×10$^{16}$ cm$^{-3}$, the impurity concentration of n-type carrier blocking layer 14 is 5×10$^{17}$ cm$^{-3}$, the impurity concentration of p-type carrier blocking layer 16 is 3×10$^{17}$ cm$^{-3}$, and the impurity concentration of p-type waveguide layer 17 is 3×10$^{17}$ cm$^{3}$. As described above with reference to FIG. 3, in a group III-V compound semiconductor, the effective mass of electrons is smaller than that of holes, and thus the carrier density of electrons is relatively higher than that of holes. In contrast, the impurity concentration of n-type carrier blocking layer 14 can be increased by adopting a configuration which satisfies N2>N3, and thus the carrier density of holes can be increased. Accordingly, this improves radiative recombination of electrons and holes in the active layer, and carriers in the active layer are not readily exhausted also in a high-output state. Thus, the heat saturation level does not drop also in the high-output state, and high-output operation can be performed.

Variation 3 of Embodiment 1

A semiconductor laser device according to Variation 3 of Embodiment 1 is to be described. A semiconductor laser device according to this variation has a configuration in which in the semiconductor laser device according to Variation 1 of Embodiment 1, p-type carrier blocking layer 16 which is an example of the third semiconductor layer includes a direct band gap semiconductor layer. The following describes the semiconductor laser device according to this variation, with reference to FIG. 6.

Figure 6:
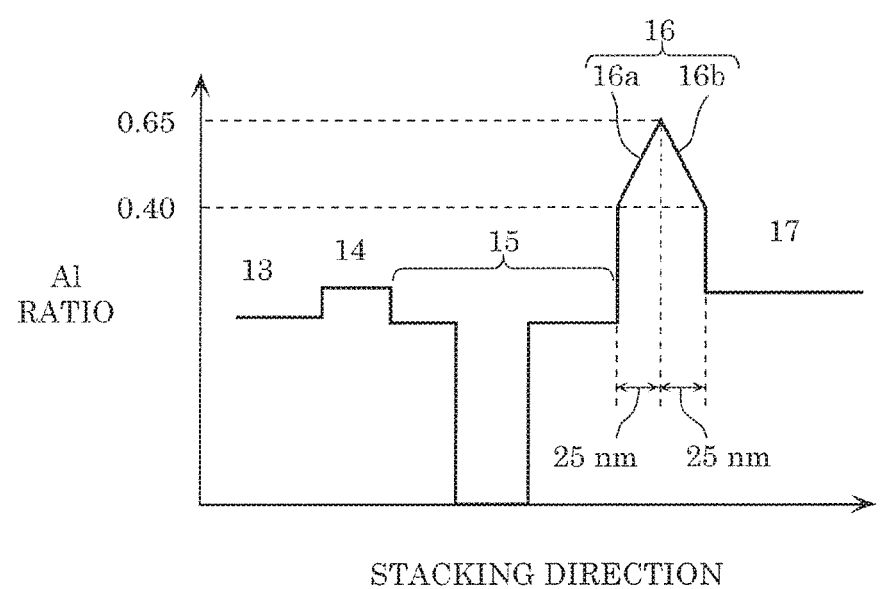
FIG. 6 is a graph schematically illustrating an Al ratio distribution of a semiconductor laser device according to Variation 3 of Embodiment 1.

FIG. 6 is a graph schematically illustrating an Al ratio distribution of the semiconductor laser device according to this variation.

Specifically as illustrated in FIG. 6, first region layer 16b of p-type carrier blocking layer 16 is formed such that the Al ratio on the p-type waveguide layer 17 side is 0.4, the Al ratio at the point of contact between first region layer 16b and second region layer 16a is 0.65, and the Al ratio of second region layer 16a on the active layer 15 side is 0.4, and first region layer 16b and second region layer 16a each have a thickness of 25 nm. In a group III-V compound semiconductor which contains Al and Ga as group III elements, if the ratio of Al is changed, band gap characteristics change between a direct band gap and an indirect band gap. When a semiconductor is made of an Al$_x$Ga$_{(1-x)}$As based material, the band gap type is changed at the border of a ratio where x is 0.42, and a semiconductor becomes a direct band gap semiconductor when x<0.42, and becomes an indirect band gap semiconductor when x>0.42. When a semiconductor is made of an (Al$_y$Ga$_{(1-y)}$)$_z$In$_{(1-z)}$P based material, it is known that if z is 0.51, the band gap type is changed at the border of a ratio when y is 0.58, and a semiconductor becomes a direct band gap semiconductor when y<0.58 and becomes an indirect band gap semiconductor when y>0.58. The direct band gap semiconductor and the indirect band gap semiconductor differ in carrier transition between the conduction band and the valence band in the band structure of the semiconductor. In the direct band gap semiconductor, carriers are transitioned in a Γ valley, whereas in the indirect band gap semiconductor, carriers are transitioned in an X valley. Thus, the transferred energy differs in the direct band gap semiconductor and the indirect band gap semiconductor, and thus if a heterojunction is formed between such semiconductors, more discontinuity occurs in the energy gap. The following describes a relation between characteristics of a semiconductor laser device and band gap types of first region layer 16b and second region layer 16a, with reference to FIG. 7A.

Figure 7A:
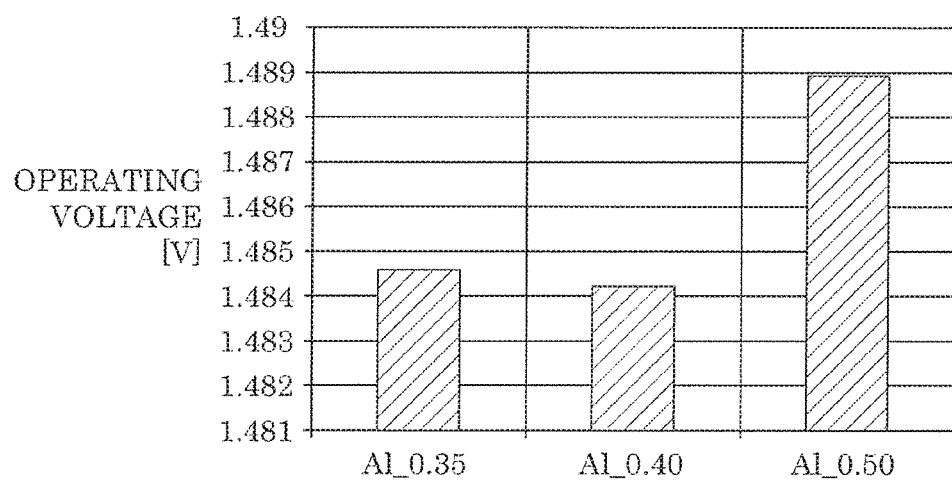
FIG. 7A is a graph illustrating a relation between an Al ratio of a first region layer and a second region layer, and an operating voltage of the semiconductor laser device.

FIG. 7A is a graph illustrating a relation between the operating voltage of the semiconductor laser device and the Al ratio of first region layer 16b and second region layer 16a. FIG. 7A illustrates the results of calculating the operating voltage at the minimum energy gap of first region layer 16b and second region layer 16a, when the Al ratio is 0.35 which achieves a direct band gap semiconductor, when the Al ratio is 0.40 which achieves a direct band gap semiconductor, and when the Al ratio is 0.5 which achieves an indirect band gap semiconductor. Note that first region layer 16b and second region layer 16a may have a thickness of 20 nm. The other configuration of the semiconductor laser device is similar to the semiconductor laser device according to Variation 1 of Embodiment 1 described above.

As illustrated in FIG. 7A, when the Al ratio of first region layer 16b and second region layer 16a is 0.50, the operating voltage is higher than that when the Al ratio is 0.40 or lower. This can be said to be resulting from an increase in band discontinuity at the hetero interface, since an adjacent layer is a direct band gap semiconductor layer. In contrast, band discontinuity is less when the Al ratio is sufficiently lowered (when the Al ratio is 0.35) so that first region layer 16b and second region layer 16a are direct band gap-type layers, yet the Al ratio changes abruptly with respect to the thickness of the region layers in which the Al ratio has a gradient, and thus smoothing the band structure resulting from the gradient of the Al ratio does not function effectively. Accordingly, when the Al ratio is sufficiently decreased, spikes of the valence band are inhibited, yet the operating voltage becomes higher than the voltage when the Al ratio is 0.40. Thus, it is considered to increase the thickness of first region layer 16b and second region layer 16a, in order to decrease the operating voltage. However, p-type carrier blocking layer 16 is a region to which an impurity is added, and thus the internal loss is increased by increasing the thickness.

A potential barrier of the conduction band is to be described with reference to FIG. 7B.

Figure 7B:
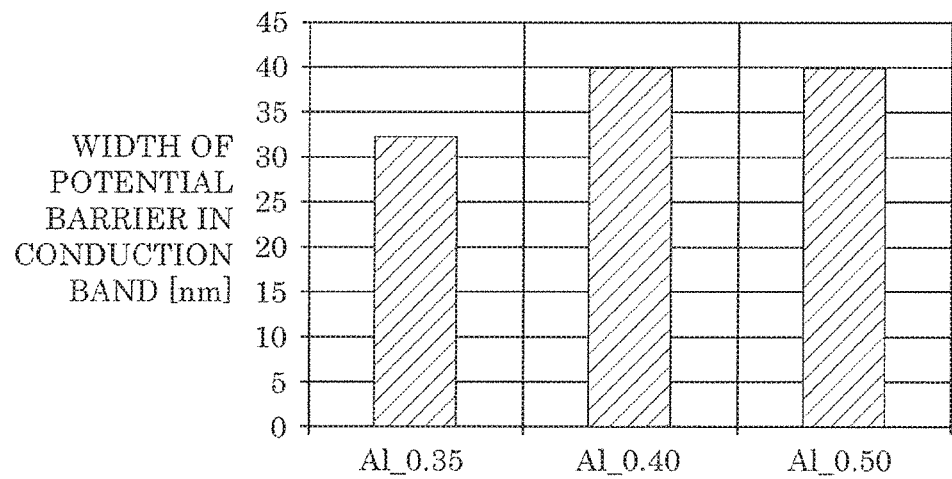
FIG. 7B is a graph illustrating a relation between an Al ratio of the first region layer and the second region layer, and a width of a potential barrier of a conduction band.

FIG. 7B is a graph illustrating a relation between the Al ratio of first region layer 16b and second region layer 16a and the width of a potential barrier of the conduction band.

As can be seen from FIG. 7B, when the Al ratio is 0.35, the width (thickness) of a potential barrier of the conduction band is smaller than the widths in other cases. This is because first region layer 16b and second region layer 16a are formed with the Al ratio of at least 0.35, which makes the layers direct band gap layers, and the thickness of first region layer 16*b* and second region layer 16*a* is 20 nm, and thus a region where a potential barrier is low is formed effectually.

The above shows that the Al ratio with which an energy gap of first region layer 16*b* and second region layer 16*a* of p-type carrier blocking layer 16 has the minimum value is set to a point shifted in the direct band gap direction by 0.5% or more and 5% or less from the Al ratio point which is a boundary between a direct band gap and an indirect band gap, whereby a rise in operating voltage is inhibited and furthermore, a potential barrier against electrons can be formed sufficient thickly. Direct band gap semiconductor layers can be stably formed also in view of manufacturing variations, and thus a semiconductor laser device can be reliably caused to operate at a low voltage using low current, generation of heat in the semiconductor laser device is inhibited, and also carriers can be highly effectively confined in active layer 15, thus achieving a semiconductor laser device which produces high light output.

P-type carrier blocking layer 16 includes an indirect band gap semiconductor layer. Accordingly, the band gap energy of p-type carrier blocking layer 16 is high. The band gap of p-type carrier blocking layer 16 can be increased for electrons weakly confined in active layer 15 due to thermal excitation, so that carriers can be more strongly confined.

Characteristics

Characteristics of the semiconductor laser device according to the present embodiment are to be described with reference to the drawings, in comparison with a semiconductor laser device according to a comparative example.

Figure 8A:
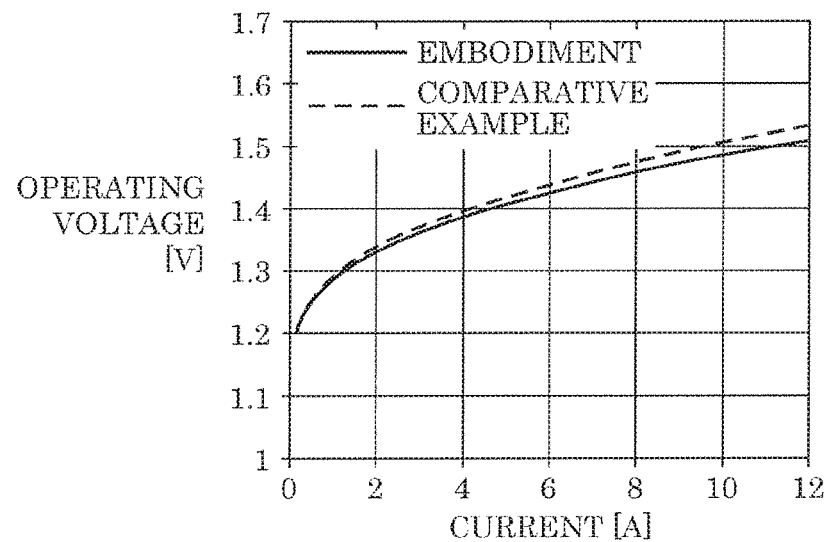
FIG. 8A is a graph illustrating a relation of an operating voltage to a current that flows in the semiconductor laser device according to Variation 2 of Embodiment 1.
Figure 8B:
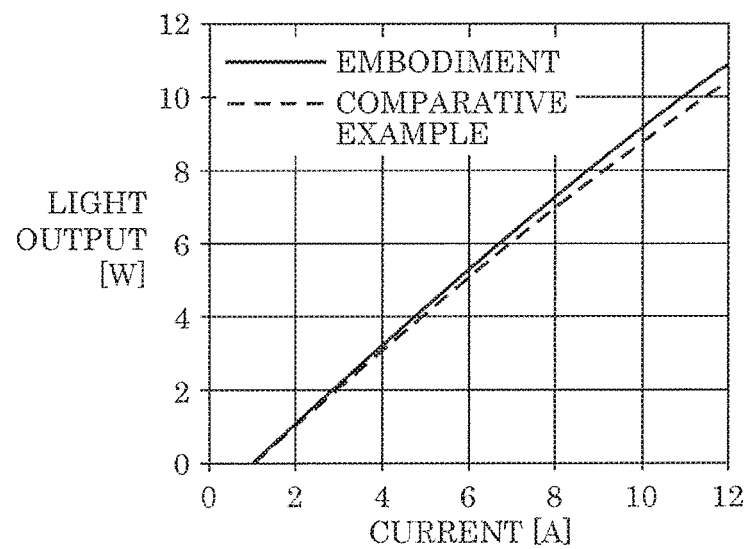
FIG. 8B is a graph illustrating a relation of light output to a current that flows in the semiconductor laser device according to Variation 2 of Embodiment 1.

FIGS. 8A and 8B are graphs illustrating relations of the operating voltage and light output with respect to a current that flows in a semiconductor laser device according to Variation 2 of the present embodiment. FIGS. 8A and 8B illustrate relations of the operating voltage and light output with respect to a current that flows in the semiconductor laser device according to Variation 2 of Embodiment 1, when the length of a resonator is 6000 μm, the stripe width is 95 μm, reflectance of the front end face is 2%, and reflectance of the rear end face is 95%. Note that FIGS. 8A and 8B also illustrate relations of the operating voltage and light output with respect to current that flows in the semiconductor laser device according to the comparative example.

As illustrated in FIG. 8A, the operating voltage applied due to the application of current of 10 A to the semiconductor laser device according to Variation 2 of the present embodiment is lower by 0.03 V than the voltage applied to the semiconductor laser device according to the comparative example. Further, as illustrated in FIG. 8B, light output in response to the application of current of 10 A by the semiconductor laser device according to Variation 2 of the present embodiment is higher by 0.5 W than the light output by the semiconductor laser device according to the comparative example. The heat resistance value at this time is approximately 8.2 K/W, and the temperature of active layer 15 in the semiconductor laser device can be decreased by approximately 5.7° C. It can be seen that a decrease in the temperature of active layer 15 can inhibit carriers from being leaked from active layer 15, and the heat saturation level in a high-output state has been improved.

Variation 4 of Embodiment 1

A semiconductor laser device according to Variation 4 of Embodiment 1 is to be described. The semiconductor laser device according to this variation has a configuration in which, in the semiconductor laser device according to Variation 2 of Embodiment 1, a value obtained by subtracting the average Al ratio of barrier layer 15*c* from the average Al ratio of p-type carrier blocking layer 16 which is an example of the third semiconductor layer is 0.35 or more.

Specifically, the Al ratio of barrier layer 15*c* is 0.2, first region layer 16*b* of p-type carrier blocking layer 16 is formed such that the Al ratio on the p-type waveguide layer 17 side is 0.42, the Al ratio at a point of contact between first region layer 16*b* and second region layer 16*a* is 0.69, and the Al ratio of second region layer 16*a* on the active layer 15 side is 0.42, and first region layer 16*b* and second region layer 16*a* each have a thickness of 30 nm.

The Al ratio at a point of contact between first region layer 16*b* and second region layer 16*a* is 0.69 and a potential barrier against electrons is sufficiently increased, whereby carriers are strongly confined in active layer 15 and furthermore, first region layer 16*b* and second region layer 16*a* are thick to have a thickness of 30 nm, thus effectively smoothing the band structure. Accordingly, this reduces the operating voltage of the semiconductor laser device according to this variation. Thus, in the semiconductor laser device according to this variation, the heat saturation level does not drop even in a high-output state, and thus the semiconductor laser device can perform high-output operation.

Furthermore, typical active layer 15 is configured such that components of TE polarized light or TM polarized light predominantly oscillate, yet if a stress from the outside is applied due to, for instance, mounting, polarization characteristics may change and components of polarized light which are originally unnecessary may produce laser oscillation. Generally, in the case of a system which includes a polarization optical element, or an optical circuit which needs only a specific polarized light component, light having an unnecessary polarized light component is light which cannot be used in the system. Accordingly, light having unnecessary polarized light components not only decrease the efficiency of the entire system as a loss, but also causes a malfunction by being present in the system as stray light. Accordingly, for example, in the system in which components of TE polarized light are used, a proportion of TE polarized light (TE/(TM+TE)) which is expressed by a ratio of TE polarized light to a total amount of light which includes TE polarized light and TM polarized light is 0.9 or more, and in particular, 0.95 or more when polarization characteristics are important. In particular, a multi-emitter semiconductor laser device having a length of a resonator that exceeds 4000 μm has an extremely large outside dimension, and thus it is extremely difficult to mount such a semiconductor laser device using low stress, so that the mounting stress to be applied to the semiconductor laser device will be great. Here, in a group III-V compound semiconductor, if the Al ratio is high, the shear modulus indicated by Young's modulus E and Poisson's ratio Y(E/(1+Y)) is known to be low. The shear modulus determines difficulty of deformation by shearing force. In view of this, a relation with polarization characteristics were examined using, as an index, a difference between a shear modulus of active layer 15 and a shear modulus of p-type carrier blocking layer 16 which is located between the mount surface and active layer 15 and adjacent to active layer 15. From these result of the examination, it was newly found that a difference in shear modulus and polarization characteristics have a close relation, and the greater the difference in shear modulus is, the more polarization characteristics improve.

Specifically, in this variation, the average Al ratio of p-type carrier blocking layer 16 is 0.555, the average Al ratio of barrier layer 15c is 0.20, and the shear modulus of p-type carrier blocking layer 16 is 30.87 GPa, and the shear modulus of barrier layer 15c is 31.93 GPa. As described above, active layer 15 and a layer adjacent to active layer 15 have different shear moduli, and thus the stress due to mounting tends not to be conveyed to active layer 15, and semiconductor laser device 100 has favorable polarization characteristics, and is allowed to stably operate.

Note that a Young's modulus and a Poisson's ratio are calculated as follows: Young's modulus=85.3−1.8×Al ratio; and Poisson's ratio=0.31+0.1×Al ratio.

The following describes, using a TE polarized light proportion as an index, a relation between a difference in average Al ratio of p-type carrier blocking layer 16 and barrier layer 15c and polarization characteristics of the semiconductor laser device mounted by junction down.

Note that a multi-emitter semiconductor laser device which includes 20 semiconductor lasers in total having the length of the resonator of 6000 μm and the stripe width of 95 μm, and disposed at intervals of 300 μm on one substrate in the direction parallel to the direction in which laser light is emitted was used to evaluate polarization characteristics. Such a semiconductor laser device is mounted on a submount by junction down, and polarization characteristics were evaluated in a state where the submount is further mounted on a copper heat sink.

A relation between p-type carrier blocking layer 16 and barrier layer 15c according to this variation is as described above. Thus, a difference in shear modulus between p-type carrier blocking layer 16 and barrier layer 15c was 1.06 GPa, and the proportion of TE polarized light of the semiconductor laser device having such a configuration was 0.95.

In contrast, polarization characteristics of the semiconductor laser device in which the Al ratio of barrier layer 15c is the same as the Al ratio in this variation, and which has three types of configurations in total in which the average Al ratio of p-type carrier blocking layer 16 is varied to 0.535 (shear modulus: 30.93 GPa, shear-modulus difference: 1.0 GPa), 0.51 (shear modulus: 31.0 GPa, shear-modulus difference: 0.93 GPa), 0.4 (shear modulus: 31.33 GPa, shear-modulus difference: 0.6 GPa) were compared with polarization characteristics of the semiconductor laser device according to this variation.

Figure 9:
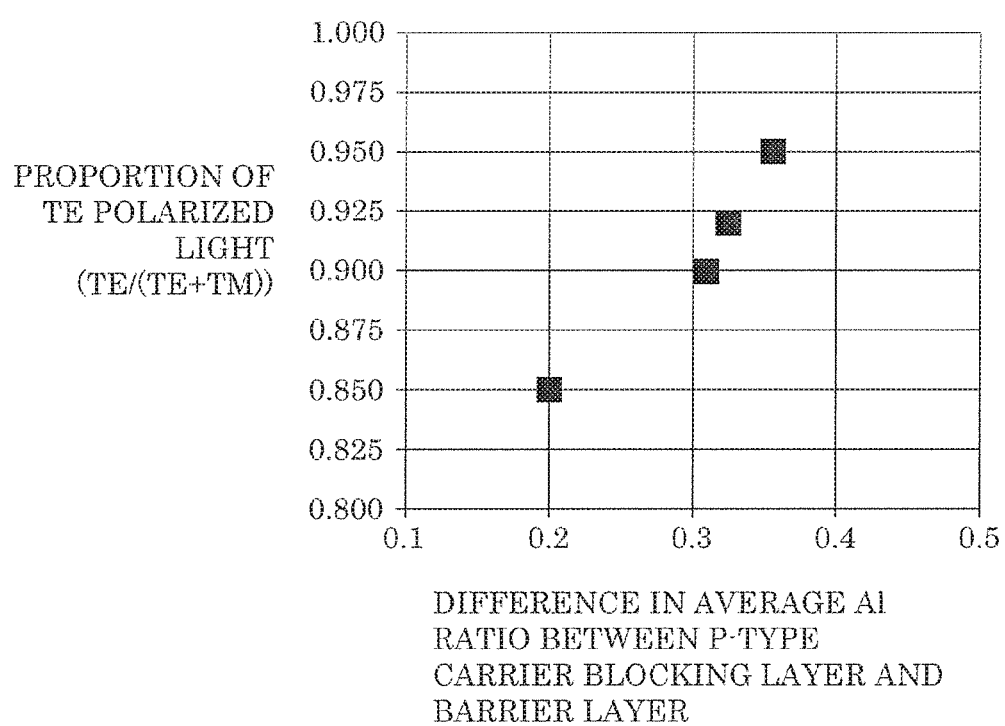
FIG. 9 is a graph illustrating a relation of a polarization ratio to a difference in an average Al ratio between a p-type carrier block layer and a barrier layer of the semiconductor laser device according to Variation 3 of Embodiment 1.

FIG. 9 is a graph illustrating a relation of the polarization ratio to a difference in average Al ratio of p-type carrier blocking layer 16 and barrier layer 15c of the semiconductor laser device according to this variation. FIG. 9 illustrates polarization characteristics of the semiconductor laser device according to this variation and polarization characteristics of the semiconductor laser having the above three types of configurations. The horizontal axis of the graph in FIG. 9 indicates a difference in average Al ratio between p-type carrier blocking layer 16 and barrier layer 15c, and the vertical axis thereof indicates a proportion of TE polarized light.

As illustrated in FIG. 9, proportions of TE polarized light of the above three types of semiconductor laser devices are 0.92 when the average Al ratio is 0.535 (difference in Al ratio: 0.325), 0.90 when the average Al ratio is 0.51 (difference in Al ratio: 0.31), and 0.85 when the average Al ratio is 0.4 (difference in Al ratio: 0.2).

Thus, the influence exerted by mounting stress onto active layer 15 can be decreased by adopting a configuration in which a difference between the average Al ratio of p-type carrier blocking layer 16 and the average Al ratio of barrier layer 15c is 0.35 or more, thus inhibiting a decrease in polarization characteristics. Note that a difference in average Al ratio may be 0.31 or more, and the proportion of TE polarized light can be set to 0.9 or more by adopting such a configuration.

From the above, deterioration of polarization characteristics of active layer 15 due to mounting stress can be inhibited even when the device is mounted by junction down, by setting a value obtained by subtracting the average Al ratio of barrier layer 15c from the average Al ratio of p-type carrier blocking layer 16 to 0.31 or more. Accordingly, this achieves a semiconductor laser device which has excellent polarization characteristics and can perform high-output operation without decreasing the heat saturation level even in a high-output state.

Embodiment 2

The following describes a semiconductor laser module according to Embodiment 2, with reference to the drawings.

Figure 10A:
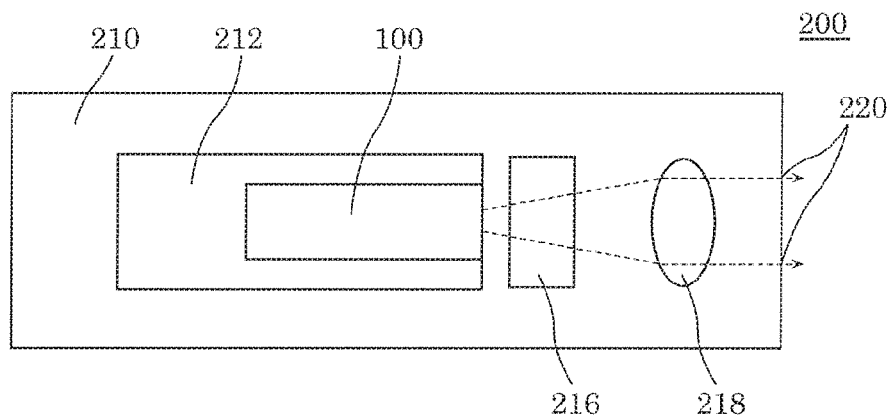
FIG. 10A is a plan view of a semiconductor laser module according to Embodiment 2.
Figure 10B:
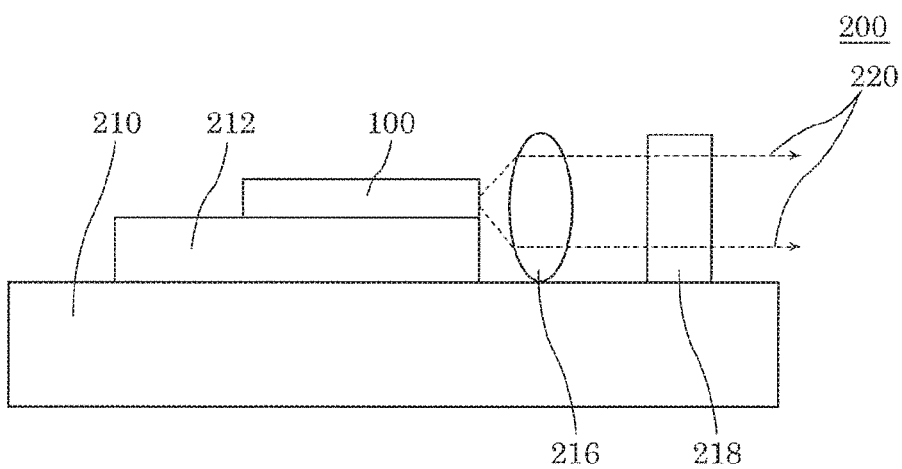
FIG. 10B is a side view of the semiconductor laser module according to Embodiment 2.

FIG. 10A is a plan view of semiconductor laser module 200 according to the present embodiment, and FIG. 10B is a side view of semiconductor laser module 200.

Semiconductor laser module 200 according to the present embodiment includes semiconductor laser device 100 according to Embodiment 1 above. Specifically, as illustrated in FIGS. 10A and 10B, semiconductor laser module 200 includes metal base 210, base 212 disposed on metal base 210, semiconductor laser device 100 disposed on base 212, and first optical element 216 and second optical element 218 which are disposed on the path of laser light 220 emitted by semiconductor laser device 100.

In semiconductor laser device 100, carriers leak out of active layer 15 due to generated heat, thus decreasing the heat saturation level. Semiconductor laser device 100 is susceptible to the influence of external force, and if an excessive stress is applied from the outside, the crystallinity of the semiconductor material deteriorates, which results in a decrease in long term reliability. Gold tin solder is usually used to mount the semiconductor laser device, and thus the semiconductor laser device is mounted under a high temperature state in which gold tin solder is about to melt. Accordingly, if the semiconductor laser device is mounted on a material having a thermal expansion coefficient greatly different from that of the semiconductor laser device, a heating-cooling process generates a mounting stress due to the difference in thermal expansion coefficient, which is to be applied to the semiconductor laser device. In the present embodiment, in view of the above, base 212 having high heat conductivity and a grating constant close to the grating constant of the semiconductor material used for semiconductor laser device 100 is disposed on metal base 210 which highly dissipates heat, and then semiconductor laser device 100 is mounted on base 212.

Metal base 210 may be made of copper, for example. Base 212 may be made of a material having a grating constant close to the grating constant of semiconductor laser device 100, and containing copper and tungsten, containing copper, tungsten, and diamond, or containing aluminum nitride. A channel through which a liquid circulates may be formed inside metal base 210. Accordingly, heat dissipation can be further improved by circulating cooling water in the channel, and thus semiconductor laser device 100 can be caused to operate to make high light output, and also a mounting stress applied to semiconductor laser device 100 is reduced, thus securing long term reliability.

First optical element 216 collimates only light in the longitudinal direction (the up and down direction in FIG. 10B), out of laser light 220 emitted by semiconductor laser device 100. Second optical element 218 collimates light in the transverse direction (the up and down direction in FIG. 10A), out of laser light 220 which includes the light in the longitudinal direction collimated by passing through first optical element 216. This configuration avoids the distance from semiconductor laser device 100 exerting influence on the shape of laser light 220. Accordingly, this achieves semiconductor laser module 200 which can efficiently use laser light 220 emitted by semiconductor laser device 100.

As described above, semiconductor laser module 200 according to the present embodiment includes semiconductor laser device 100 according to Embodiment 1, and thus a high-output semiconductor laser module which can perform low-power operation.

Note that semiconductor laser device 100 according to Embodiment 1 is used in the present embodiment, yet the present embodiment is not limited thereto. For example, the semiconductor laser device according to Variation 1, 2, or 3 of Embodiment 1 may be used.

Semiconductor laser device 100 may have a multi-emitter structure which includes, on one substrate, a plurality of semiconductor laser devices 100 according to Embodiment 1 or a plurality of the semiconductor laser devices according to Variation 1, 2, or 3 of Embodiment 1. The light output from the semiconductor laser module can be further increased by using the semiconductor laser device having a multi-emitter structure.

Embodiment 3

Figure 11:
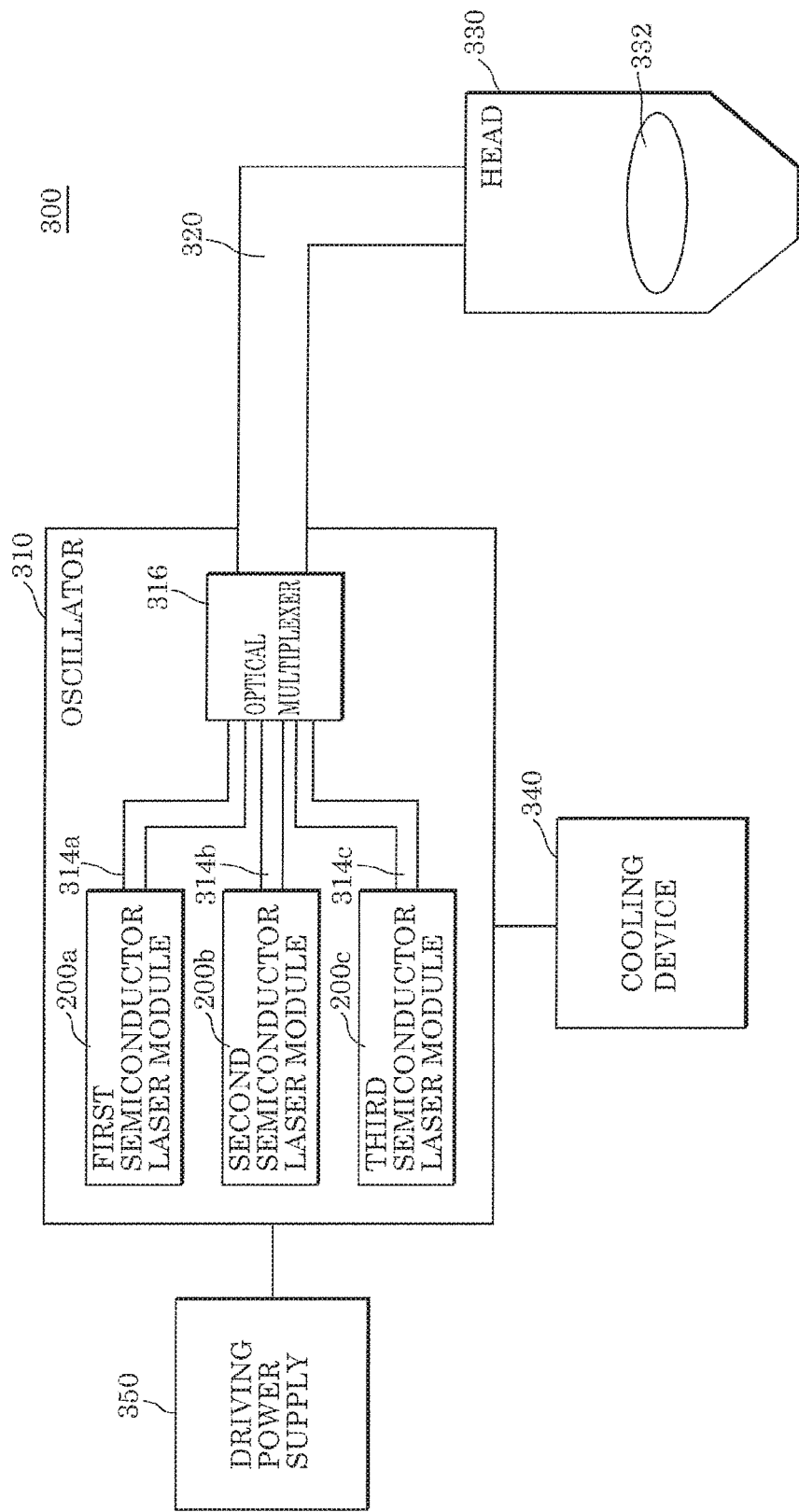
FIG. 11 is a schematic diagram of a laser light source system for welding according to Embodiment 3.
Figure 12A:
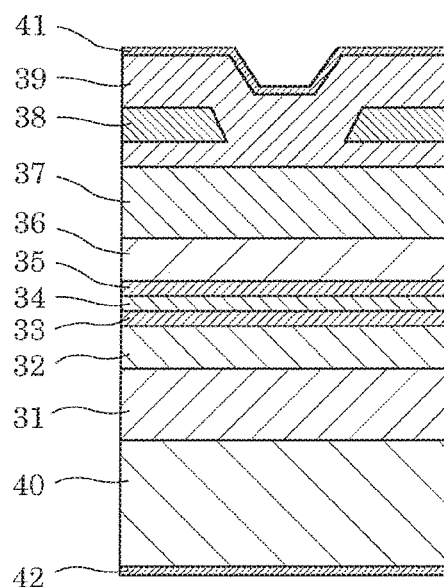
FIG. 12A is a schematic diagram illustrating a cross-sectional structure of a semiconductor laser device according to conventional technology.
Figure 12B:
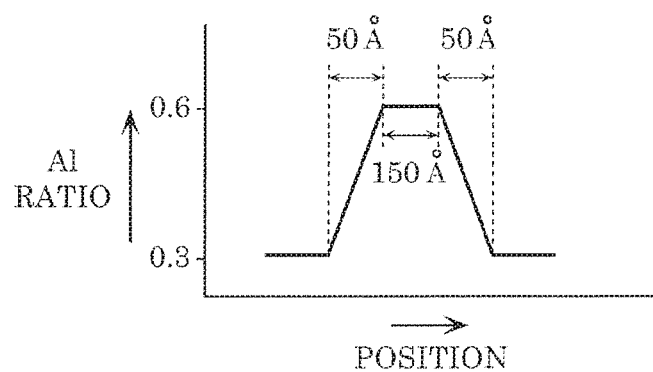
FIG. 12B is a schematic diagram illustrating an Al ratio distribution of a p-type carrier block layer of the semiconductor laser device according to the conventional technology.

The following describes a laser light source system for welding according to Embodiment 3 with reference to FIG. 11.

FIG. 11 is a schematic diagram of laser light source system 300 for welding according to the present embodiment.

As illustrated in FIG. 11, laser light source system 300 for welding includes oscillator 310, head 330, light path 320 between oscillator 310 and head 330, driving power supply 350 for driving oscillator 310, and cooling device 340 for cooling oscillator 310.

Oscillator 310 includes first semiconductor laser module 200a, second semiconductor laser module 200b, third semiconductor laser module 200c, optical multiplexer 316, and first to third light paths 314a to 314c provided between optical multiplexer 316 and first to third semiconductor laser modules 200a to 200c. First to third semiconductor laser modules 200a to 200c are semiconductor laser modules 200 according to Embodiment 2, for example. Accordingly, laser light source system 300 for welding includes a semiconductor laser device which emits laser light, as a light source.

Head 330 includes optical element 332. Optical element 332 is, for instance, a convex lens having a light concentrating function, for example.

First to third semiconductor laser modules 200a to 200c of oscillator 310 receives power supply from driving power supply 350, and output collimated laser light.

Three laser light beams output from first to third semiconductor laser modules 200a to 200c pass through first light path 314a, second light path 314b, and third light path 314c, respectively, and are guided to optical multiplexer 316. First to third light paths 314a to 314c can be achieved using, for example, optical elements such as optical fibers or reflection mirrors.

Optical multiplexer 316 has a function for multiplexing the three laser light beams guided along first to third light paths 314a to 314c into a light beam that travels along a single light path. Optical multiplexer 316 can be achieved using, for instance, a multiplexing prism or a diffraction grating, for example. Optical multiplexer 316 simplifies light path 320 to head 330 even when a plurality of semiconductor laser modules are included.

Light path 320 can be achieved by an optical element such as an optical fiber or a reflection mirror, similarly to first to third light paths 314a to 314c. When laser light source system 300 for welding has a configuration in which head 330 is fixed, light path 320 may be achieved by an optical element such as a reflection mirror. When laser light source system 300 for welding has a configuration in which head 330 is movably included, light path 320 may be achieved by an optical fiber.

Optical element 332 of head 330 causes laser light guided from oscillator 310 via light path 320 to concentrate at one point. This allows laser light from semiconductor laser devices included in first to third semiconductor laser modules 200a to 200c to be directly emitted onto a welding object with high light density. Furthermore, laser light from the semiconductor laser devices can be directly used, and thus the wavelength of laser light to be used can be readily changed by changing the semiconductor laser devices. Accordingly, the wavelength according to the light absorption rate of an object to be welded can be selected, thus increasing the efficiency of the welding process.

Light path 320 is achieved by an amplification optical fiber having an optical fiber core to which rare earth is added, and fiber bragg gratings (FBGs) having a function for confining light in the amplification optical fiber are provided at the ends of the amplification optical fiber, whereby a fiber laser welding device can be achieved which uses light amplified by the amplification optical fiber as light from a light source for welding.

As described above, laser light source system 300 for welding according to the present embodiment includes the semiconductor laser modules each of which includes semiconductor laser device 100 according to Embodiment 1, and thus a high-output laser light source system for welding which can perform low-power operation can be achieved.

Note that first to third semiconductor laser modules 200a to 200c used in the present embodiment each include semiconductor laser device 100 according to Embodiment 1, yet the present embodiment is not limited thereto. For example, first to third semiconductor laser modules 200a to 200c may each include the semiconductor laser device according to Variation 1, 2, or 3 of Embodiment 1, or may each include a semiconductor laser device having a multi-emitter structure which includes a plurality of emitters.

Laser light source system 300 for welding according to the present embodiment includes three semiconductor laser modules, yet the present embodiment is not limited thereto. In this case, higher light output can be obtained by increasing the number of semiconductor laser modules included.

Laser light source system 300 for welding according to the present embodiment can also be achieved as a laser welding device in a laser welding facility, for instance.

Laser light source system 300 for welding according to the present embodiment can also be achieved as a laser beam cutting device in a laser-beam-cutting facility, for instance, by driving, using pulses, a semiconductor laser device included in a semiconductor laser module.

Other Variations and Others

The above has described the semiconductor laser device and others according to the present disclosure, based on the embodiments and the variations thereof, yet the present disclosure is not limited to the above embodiments and variations.

For example, in Embodiment 1 and the variations thereof, active layer 15 has a single quantum well structure, yet the structure of active layer 15 is not limited to this. Active layer 15 may have a multi quantum well (MQW) structure which has a plurality of quantum well layers, for example.

In Embodiment 1 and the variations thereof, active layer 15 is made of InGaAs, yet the material of active layer 15 is not limited to this. Active layer 15 may be made of a GaAs based material, a GaAsP based material, or an InGaP based material, for example.

Al ratios of the n-type buffer layer, the n-type cladding layer, the n-type waveguide layer, the p-type waveguide layer, and the p-type cladding layer are constant. The Al ratio distribution in each of the layers is not limited to a uniform distribution. For example, the Al ratio may be caused to continuously vary between the n-type substrate and the n-type buffer layer, between the n-type buffer layer and the n-type cladding layer, between the n-type cladding layer and the n-type waveguide layer, between the p-type waveguide layer and the p-type cladding layer, and between the p-type cladding layer and the p-type contact layer.

The present disclosure may also include embodiments as a result of adding, to the embodiments, various modifications that may be conceived by those skilled in the art, and embodiments obtained by combining elements and functions in the embodiments in any manner without departing from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser device according to the present disclosure can perform low-power and high-output operation, and thus is useful as, for example, welding light sources, a projector light sources, a display light sources, illumination light sources, and light sources used in other electronic devices and information processing devices, for instance.

What is claimed is:
1. A semiconductor laser device, comprising:
a first semiconductor layer on an n side;
a second semiconductor layer on the n side, the second semiconductor layer having band gap energy higher than band gap energy of the first semiconductor layer;
an active layer;
a third semiconductor layer on a p side;
a fourth semiconductor layer on the p side, the fourth semiconductor layer having band gap energy lower than band gap energy of the third semiconductor layer;
an n-type cladding layer; and
a p-type cladding layer, wherein
$Eg2<Eg3$ is satisfied, where $Eg2$ denotes a maximum value of the band gap energy of the second semiconductor layer, and $Eg3$ denotes a maximum value of the band gap energy of the third semiconductor layer,
the third semiconductor layer includes a first region layer in which band gap energy monotonically decreases toward the fourth semiconductor layer,
$N2>N3$ is satisfied, where $N2$ denotes an impurity concentration of the second semiconductor layer, and $N3$ denotes an impurity concentration of the third semiconductor layer,
the first semiconductor layer, the second semiconductor layer, the third semiconductor layer, and the fourth semiconductor layer are between the n-type cladding layer and the p-type cladding layer,
the n-type cladding layer is adjacent to the first semiconductor layer,
the p-type cladding layer is adjacent to the fourth semiconductor layer,
$Eg1<Eg4$ is satisfied, where $Eg1$ denotes a maximum value of the band gap energy of the first semiconductor layer, and $Eg4$ denotes a maximum value of the band gap energy of the fourth semiconductor layer,
the first semiconductor layer is a first waveguide layer,
the fourth semiconductor layer is a second waveguide layer,
light is generated in the active layer, and
a center position of an intensity of the light is located closer to the first semiconductor layer than to the active layer.

2. The semiconductor laser device according to claim 1, wherein a minimum value of the band gap energy of the third semiconductor layer is greater than $Eg2$.

3. The semiconductor laser device according to claim 1, wherein the third semiconductor layer has a thickness greater than a thickness of the second semiconductor layer.

4. The semiconductor laser device according to claim 1, wherein the third semiconductor layer includes, between the first region layer and the active layer, a second region layer in which band gap energy monotonically increases toward the first region layer.

5. The semiconductor laser device according to claim 4, wherein a maximum value of the band gap energy of the first region layer and a maximum value of the band gap energy of the second region layer are equal.

6. The semiconductor laser device according to claim 4, wherein the second region layer has a thickness of 20 nm or more.

7. The semiconductor laser device according to claim 1, wherein the first region layer has a thickness of 20 nm or more.

8. The semiconductor laser device according to claim 1, wherein the third semiconductor layer includes an indirect band gap semiconductor layer.

9. The semiconductor laser device according to claim 1, wherein
the third semiconductor layer includes a group III-V compound semiconductor containing Al, and
an Al ratio in the first region layer has a gradient.

10. The semiconductor laser device according to claim 9, wherein the first region layer includes an AlGaAs based crystal or an AlGaInP based crystal.

11. The semiconductor laser device according to claim 1, wherein the first region layer includes a direct band gap semiconductor layer.

12. The semiconductor laser device according to claim 1, wherein $N2-N1 \geq N3-N4$ is satisfied, where $N1$ denotes an impurity concentration of the first semiconductor layer, and N4 denotes an impurity concentration of the fourth semiconductor layer.

13. The semiconductor laser device according to claim 1, wherein N2 which denotes the impurity concentration of the second semiconductor layer is $7 \times 10^{17}$ cm$^{-3}$ or less.

14. The semiconductor laser device according to claim 1, wherein Eg1≤Eg3 min is satisfied, where Eg1 denotes a maximum value of the band gap energy of the first semiconductor layer, and Eg3 min denotes band gap energy in a portion of the first region layer adjacent to the fourth semiconductor layer.

15. The semiconductor laser device according to claim 1, wherein
  the first semiconductor layer and the second semiconductor layer are in contact with each other, and
  the third semiconductor layer and the fourth semiconductor layer are in contact with each other.

16. The semiconductor laser device according to claim 1, wherein
  the second semiconductor layer is an n-type carrier blocking layer, and
  the third semiconductor layer is a p-type carrier blocking layer.

17. The semiconductor laser device according to claim 16, wherein
  the active layer includes a barrier layer, and
  a value obtained by subtracting an average Al ratio of the barrier layer from an average Al ratio of the p-type carrier blocking layer is 0.31 or more.

18. A semiconductor laser module, comprising:
  the semiconductor laser device according to claim 1.

19. A laser light source system for welding, comprising:
  the semiconductor laser module according to claim 18.

20. The semiconductor laser device according to claim 1, wherein
  the first waveguide layer is an n-type waveguide layer, and
  the second waveguide layer is a p-type waveguide layer.

* * * * *